US 12,113,052 B2

(12) United States Patent
Simsek-Ege

(10) Patent No.: US 12,113,052 B2
(45) Date of Patent: Oct. 8, 2024

(54) MEMORY DEVICES AND ELECTRONIC SYSTEMS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/491,678

(22) Filed: Oct. 20, 2023

(65) Prior Publication Data

US 2024/0047428 A1 Feb. 8, 2024

Related U.S. Application Data

(63) Continuation of application No. 17/344,519, filed on Jun. 10, 2021, now Pat. No. 11,848,309.

(51) Int. Cl.
*H01L 25/065* (2023.01)
*H01L 23/00* (2006.01)
(Continued)

(52) U.S. Cl.
CPC ........ *H01L 25/0657* (2013.01); *H01L 23/528* (2013.01); *H01L 23/53228* (2013.01);
(Continued)

(58) Field of Classification Search
CPC ..... H01L 25/0657; H01L 25/50; H01L 24/08; H01L 24/80; H01L 23/528; H01L 23/53228
See application file for complete search history.

(56) References Cited

U.S. PATENT DOCUMENTS 8,067,286 B2 11/2011 Parekh et al.
8,153,499 B2 4/2012 Or-Bach et al.
(Continued)

FOREIGN PATENT DOCUMENTS

| CN | 109887920 A | 6/2019 |
| TW | 201203539 A | 1/2012 |
| TW | 202040800 A | 11/2020 |

OTHER PUBLICATIONS

International Search Report for International Application No. PCT/US2022/072354, mailed Aug. 31, 2022, 4 pages.
(Continued)

*Primary Examiner* — Nathan W Ha
(74) *Attorney, Agent, or Firm* — TraskBritt

(57) ABSTRACT

A microelectronic device comprises a first microelectronic device structure and a second microelectronic device structure attached to the first microelectronic device structure. The first microelectronic device structure comprises a memory array region comprising a stack structure comprising levels of conductive structures vertically alternating with levels of insulative structures, and staircase structures at lateral ends of the stack structure. The memory array region further comprises vertical stacks of memory cells, at least one of the vertical stacks of memory cells comprising stacked capacitor structures, each stacked capacitor structure comprising capacitor structures vertically spaced from each other by at least a level of the levels of insulative structures, transistor structures, each transistor structure operably coupled to a capacitor structure and to one of the conductive structures of the levels of conductive structures, and a conductive pillar structure vertically extending through the transistor structures.

20 Claims, 34 Drawing Sheets

(51) Int. Cl.
  *H01L 23/528* (2006.01)
  *H01L 23/532* (2006.01)
  *H01L 25/00* (2006.01)

(52) U.S. Cl.
  CPC .............. *H01L 24/08* (2013.01); *H01L 24/80* (2013.01); *H01L 25/50* (2013.01); *H01L 2224/08145* (2013.01); *H01L 2224/80896* (2013.01); *H01L 2225/06541* (2013.01)

(56) References Cited

U.S. PATENT DOCUMENTS

| | | | |
|---|---|---|---|
| 8,184,471 | B2 | 5/2012 | Woo et al. |
| 8,546,188 | B2 | 10/2013 | Liu et al. |
| 8,716,116 | B2 | 5/2014 | Parekh et al. |
| 9,543,433 | B2 | 1/2017 | Anathan et al. |
| 10,665,580 | B1 | 5/2020 | Hosoda et al. |
| 2009/0325343 | A1 | 12/2009 | Lee |
| 2010/0301926 | A1 | 12/2010 | Dell et al. |
| 2014/0254231 | A1 | 9/2014 | Cernea et al. |
| 2014/0308789 | A1 | 10/2014 | Kai et al. |
| 2019/0024493 | A1 | 1/2019 | Johnson et al. |
| 2019/0074277 | A1 | 3/2019 | Ramaswamy |
| 2019/0081069 | A1 | 3/2019 | Lu et al. |
| 2019/0244933 | A1 | 8/2019 | Or-Bach et al. |
| 2020/0066730 | A1 | 2/2020 | Guo et al. |
| 2020/0105721 | A1 | 4/2020 | Park |
| 2020/0111793 | A1 | 4/2020 | Kim et al. |
| 2020/0258876 | A1 | 8/2020 | Hosoda et al. |
| 2020/0279601 | A1 | 9/2020 | Kim et al. |
| 2020/0328180 | A1 | 10/2020 | Cheng et al. |
| 2020/0381046 | A1 | 12/2020 | Redaelli et al. |
| 2020/0411078 | A1 | 12/2020 | Sharma et al. |
| 2021/0217730 | A1 | 7/2021 | Parekh et al. |
| 2021/0375790 | A1 | 12/2021 | Oda et al. |
| 2021/0398945 | A1* | 12/2021 | Parekh .................... H01L 25/18 |
| 2021/0407980 | A1* | 12/2021 | Young .................. H01L 29/4175 |
| 2021/0408033 | A1* | 12/2021 | Baraskar ............. H01L 25/0657 |
| 2022/0068859 | A1 | 3/2022 | Choi et al. |
| 2022/0102334 | A1 | 3/2022 | Kim et al. |
| 2022/0130846 | A1 | 4/2022 | Kim et al. |
| 2022/0187365 | A1 | 6/2022 | Song et al. |
| 2022/0189984 | A1 | 6/2022 | Okina |
| 2022/0208748 | A1 | 6/2022 | Rabkin et al. |
| 2022/0223525 | A1 | 7/2022 | Hwang et al. |
| 2022/0246562 | A1 | 8/2022 | Hou et al. |
| 2022/0285233 | A1 | 9/2022 | Li et al. |
| 2022/0352104 | A1 | 11/2022 | Hou et al. |
| 2022/0359441 | A1 | 11/2022 | Hasnat et al. |
| 2022/0359555 | A1 | 11/2022 | Toyama et al. |
| 2022/0367393 | A1 | 11/2022 | Shao et al. |

OTHER PUBLICATIONS

International Written Opinion for International Application No. PCT/US2022/072354, mailed Aug. 31, 2022, 5 pages.

Taiwanese Search Report and Office Action from Taiwanese Application No. 111119968, dated Aug. 14, 2023, 8 pages with English translation.

* cited by examiner

MEMORY DEVICES AND ELECTRONIC SYSTEMS

CROSS-REFERENCE TO RELATED APPLICATION

This application is a continuation of U.S. patent application Ser. No. 17/344,519, filed Jun. 10, 2021, now U.S. Pat. No. 11,843,309, issued Dec. 19, 2023, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random-access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device.

DETAILED DESCRIPTION

Figure 1A:
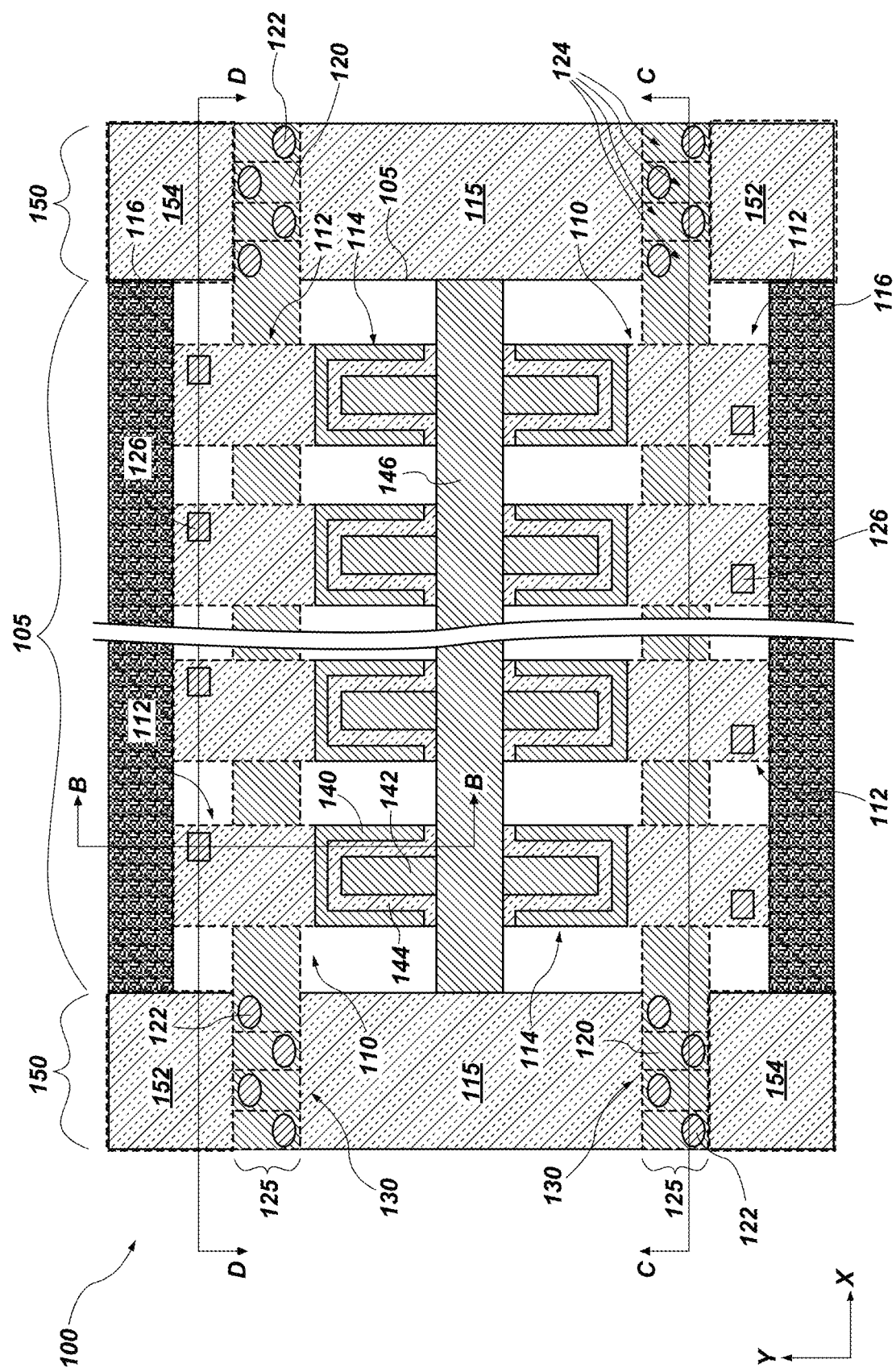
FIG. 1A through FIG. 1K include simplified partial top-down views (FIG. 1A, FIG. 1F), simplified partial cross-sectional views (FIG. 1B through FIG. 1D, FIG. 1G through FIG. 1K), and a simplified partial perspective view (FIG. 1E) illustrating embodiments of a method of forming a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes a first microelectronic device structure and at least a second microelectronic device structure coupled to the first microelectronic device structure. The first microelectronic device structure may include, for example, a memory array including vertical stacks of memory cells, each stack of memory cells comprising a stack of capacitor structures, each capacitor structure operably coupled to an access device (e.g., a transistor) of a stack of access devices. The access devices and the capacitor structures may be vertically spaced from each other by one or more insulative structures. A stack structure comprising vertically alternating levels of conductive structures and insulative structures laterally neighbors the capacitor structures and extends through and intersects the stack of access devices. Conductive structures of the stack structure may be operably coupled to the access devices. In some embodiments, each access device may be configured to be operably coupled to conductive structure (also referred to as a "first conductive line" or a "word line") vertically neighboring the respective access device. Lateral ends of the stack structure may comprise a staircase structure including steps, each step defined at a lateral edge of a conductive structure. Each step may individually be in electrical communication with a conductive contact structure that is, in turn, in electrical communication with additional circuitry of the microelectronic device, such as one or more components of the second microelectronic device structure. A conductive pillar structure (also referred to as a "second conductive line") may vertically extend through each vertical stack of memory cells, such as through the access devices of the stack of access devices. The conductive pillar structure may be electrically coupled to one or more components of the microelectronic device, such as one or more components of the second microelectronic device structure. The first microelectronic device structure may further include socket regions including electrical connections for coupling to back end of the line (BEOL) structures (e.g., circuitry) of the microelectronic device.

The second microelectronic device structure may include control logic devices configured to effectuate at least a portion of control operations for the stacks of memory cells. The second microelectronic device may include various high performance complementary metal oxide semiconductor (CMOS) circuitry, such as, for example, sense amplifier circuitry, word line driver circuitry, other CMOS circuitry, and BEOL structures. The conductive contact structures of the first microelectronic device structure may be electrically coupled to conductive pad structures on a back side of the second microelectronic device structure and BEOL structures of the microelectronic device. In some embodiments, the conductive contact structures of the first microelectronic device structure are electrically coupled to word line driver circuitry of the second microelectronic device structure. The conductive pillar structures of each of the stacks of memory cells may be operably coupled to sense amplifier circuitry of the second microelectronic device structure through one or more conductive interconnect structures.

The first microelectronic device structure and the second microelectronic device structure may be formed separately, and attached to each other to form the microelectronic device. After forming the memory array of the first microelectronic device structure, global conductive structures may be formed in electrical communication with the conductive pillar structure of each of the stacks of memory cells. In some embodiments, sacrificial structures may be formed over the staircase structures and in contact with each conductive contact structure of the staircase structure. Additional sacrificial structures may be formed over conductive interconnect structures within a socket region of the first microelectronic device structure and over and in contact with the global conductive structures. A first oxide material may be formed over the sacrificial structures. The second microelectronic device structure may be fabricated independently of the first microelectronic device structure. In some embodiments, one or more sacrificial structures are formed within the second microelectronic device structure and in contact with various circuitry (e.g., word line driver circuitry, sense amplifier circuitry, other CMOS circuitry) and structures (e.g., bond pad structures) of the second microelectronic device structure. In other embodiments, the second microelectronic device structure does not include sacrificial structures. A second oxide material may be formed over the second microelectronic device structure and bonded to the first oxide material of the first microelectronic device structure to form the microelectronic device. Openings may be formed through the second microelectronic device structure to expose at least some of the sacrificial structures of the first microelectronic device structure (and the additional sacrificial structures of the second microelectronic device structure, if present). The sacrificial structures may be removed (e.g., exhumed) through the openings and replaced with conductive material to form one or more conductive structures (e.g., conductive pad structures, conductive lines, conductive interconnect structures) within voids remaining after removal of the sacrificial structures and the openings. Replacement of the sacrificial structures with conductive material may facilitate simultaneous electrical connection of various circuitry of the first microelectronic device structure (e.g., the conductive contact structures, the conductive pillar structures, the global conductive structures, the socket regions) with circuitry (e.g., word line driver circuitry, sense amplifier circuitry) of the second microelectronic device structure. In some embodiments, the conductive material with which the sacrificial structures are replaced comprises a so-called "low RC" material, facilitating improved data transmission of data between the circuitry of the first microelectronic device structure and the circuitry of the second microelectronic device structure.

FIG. 1A through FIG. 1K are simplified partial top-down views (FIG. 1A, FIG. 1F), simplified partial cross-sectional views (FIG. 1B through FIG. 1D, FIG. 1G through FIG. 1K), and a simplified partial perspective view (FIG. 1E) illustrating embodiments of a method of forming a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIG. 1A through FIG. 1K may be used in various devices and electronic systems. The first microelectronic device structure 100 may also be referred to herein as a die or a wafer.

Referring to FIG. 1A, the first microelectronic device structure 100 includes an array region 105 and one or more peripheral regions 150 located external to the array region 105. In some embodiments, the peripheral regions 150 laterally (e.g., in at least X-direction) surround the array region 105. In some embodiments, the peripheral region 150 substantially surrounds all horizontal boundaries (e.g., an entire horizontal area) of the array region 105.

The array region 105 may include vertical (e.g., in the Z-direction; into and out of the page in the view of FIG. 1A) stacks of memory cells 110, each vertical stack of memory cells 110 comprising a vertical stack of access devices 112 (illustrated in broken lines in FIG. 1A) and a vertical stack of storage devices 114, which are more fully described with reference to FIG. 1B. Although FIG. 1A illustrates eight (8) vertical stacks of memory cells 110, the disclosure is not so limited and the array region 105 may include greater than eight vertical stacks of memory cells 110.

The access devices 112 may each individually be operably coupled to a first conductive structure 120 (illustrated in broken lines) of a stack structure 125 comprising levels of the conductive structures 120 (also referred to herein as "first conductive lines" or "word lines") vertically (e.g., in the Z-direction) spaced from one another by one or more insulative materials (not illustrated in FIG. 1A for clarity and ease of understanding the description). The conductive structures 120 may be configured to provide sufficient current through a channel region (e.g., channel material 151 (FIG. 1B)) of each of the access devices 112 to electrically couple the storage device 114 to, for example, a conductive pillar structure (e.g., conductive pillar structure 126 (FIG. 1B)). The stack structure 125 may intersect the vertical stacks of memory cells 110, such as the vertical stacks of the access devices 112 of the vertical stacks of memory cells 110. In other words, and with reference to FIG. 1A, the stack structure 125 extends through the vertical stacks of access devices 112.

The access devices 112 may be electrically coupled to a conductive plate 116, which may be configured to enable excess carriers (e.g., holes) to drain from a body region of the access devices 112 during operation of the memory cells 110. The conductive plate 116 may comprise conductive material, such as, for example, a metal, a conductive metal silicide, a conductive metal nitride, or conductively-doped semiconductive material (e.g., silicon, germanium).

The conductive structures 120 may laterally (e.g., in the X-direction) terminate at staircase structures 130 (illustrated in broken lines in FIG. 1A) located at laterally (e.g., in the X-direction) terminal portions of the stack structure 125. As will be described herein, vertically (e.g., in the Z-direction) higher conductive structures 120 may have a smaller lateral dimension (e.g., in the X-direction) than vertically lower conductive structures 120, such that lateral edges of the conductive structures 120 at least partially define steps 124 of the staircase structures 130.

Although FIG. 1A illustrates two staircase structures 130 for every stack structure 125 (e.g., a staircase structure 130 at each lateral (e.g., in the X-direction) end of the stack structure 125), the disclosure is not so limited. In other embodiments, the stack structure 125 may include one staircase structure 130 located at only one lateral end of the stack structure 125.

First conductive contact structures 122 may be in electrical communication with individual conductive structures 120 at the steps 124. In some embodiments, each step 124 may be in electrical communication with a first conductive contact structure 122 at each lateral (e.g., in the X-direction) end of the staircase structure 130. In other embodiments, every other step 124 of the staircase structures 130 may include a first conductive contact structure 122 in contact therewith. In other words, every other step 124 of the staircase structures 130 may individually be in contact with a first conductive contact structure 122. In some such embodiments, each step 124 of a first staircase structure 130 at a first lateral end of the stack structure 125 not in electrical contact with a first conductive contact structure 122 may individually be in electrical communication with a first conductive contact structure 122 at a second staircase structure 130 at a second, opposite lateral end of the stack structure 125.

Figure 1B:
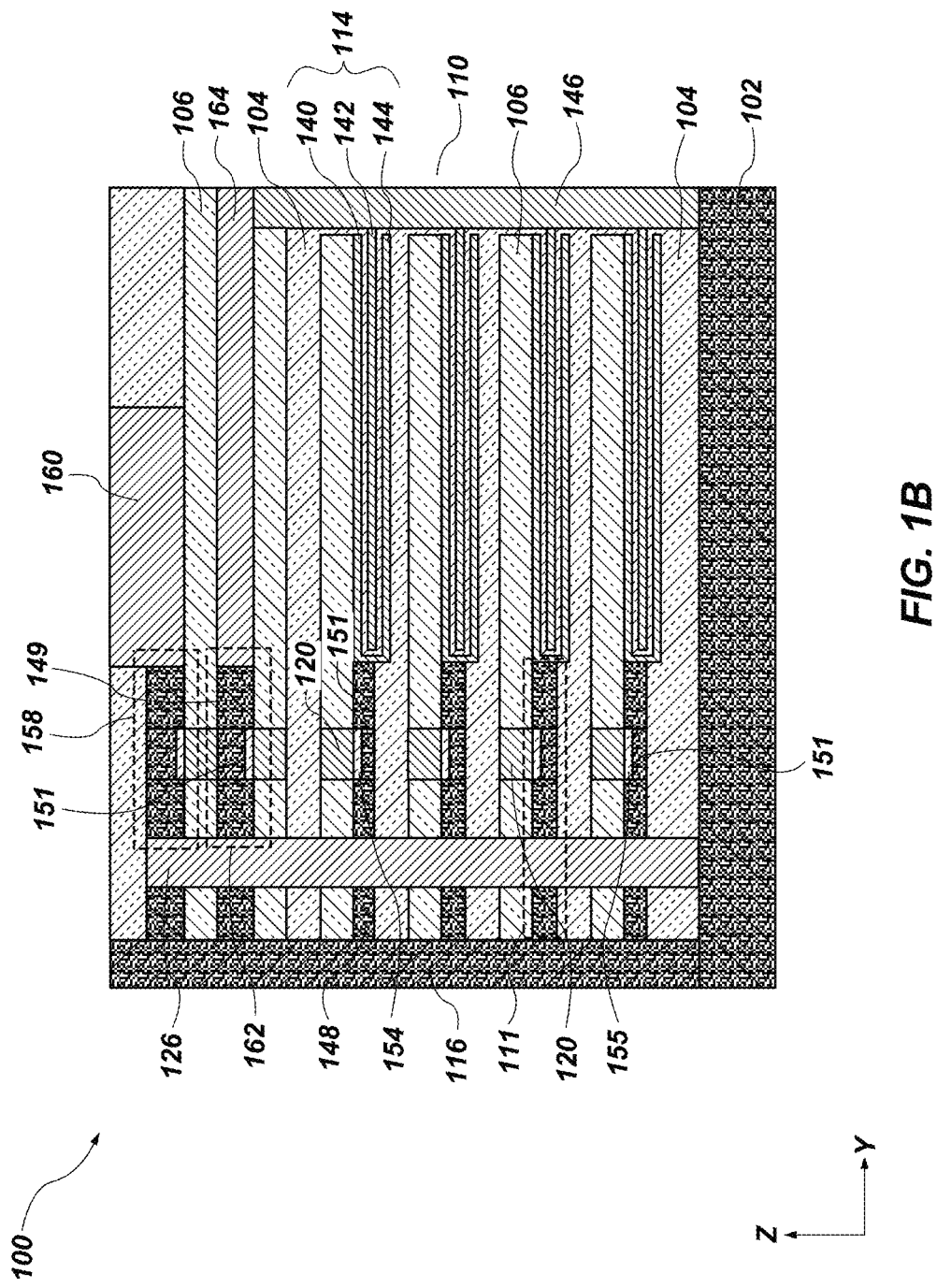

With reference to FIG. 1A and FIG. 1B, the first microelectronic device structure 100 may include conductive pillar structures 126 vertically (e.g., in the Z-direction) extending through the first microelectronic device structure 100. The conductive pillar structures 126 may also be referred to herein as "digit lines," "second conductive lines," or "digit line pillar structures." The conductive pillar structures 126 may be electrically coupled to the access devices 112 to facilitate operation of the memory cells 110.

The peripheral regions 150 may include first conductive contact exit regions 152 (illustrated in broken lines in FIG. 1A) on a first lateral (e.g., in the Y-direction) side of the staircase structures 130 of each of the stack structures 125. In some embodiments, the first conductive contact exit regions 152 are located at corners of the first microelectronic device structure 100 laterally (e.g., in the Y-direction) neighboring the stack structure 125 in a first lateral direction and laterally (e.g., in the X-direction) neighboring the array region 105 (e.g., the conductive plate 116) in a second lateral direction. In some embodiments, the first conductive contact exit regions 152 may be located at diagonally opposing corners of the first microelectronic device structure 100. In other words, the first conductive contact exit regions 152 may be located at opposing lateral (e.g., in the X-direction and in the Y-direction) ends of the first microelectronic device structure 100. As will be described herein, the first conductive contact exit regions 152 may comprise locations of the first microelectronic device structure 100 at which the first conductive contact structures 122 exit the first microelectronic device structure 100 and electrically connect to a second microelectronic device structure (e.g., second microelectronic device structure 200 (FIG. 2A)).

A second conductive contact exit region 154 (illustrated in broken lines in FIG. 1A) may be located on a second, opposite lateral (e.g., in the X-direction) side of each of the stack structures 125 relative to the first conductive contact exit region 152 of the respective stack structure 125. In some embodiments, the second conductive contact regions 154 are located at corners of the first microelectronic device structure 100 laterally (e.g., in the Y-direction) neighboring the stack structure 125 in a first lateral direction and laterally (e.g., in the X-direction) neighboring the array region 105 (e.g., the conductive plate 116) in a second lateral direction. In some embodiments, the second conductive contact exit regions 154 may be located at diagonally opposing corners of the first microelectronic device structure 100. In other words, the second conductive contact exit regions 154 may be located at opposing lateral (e.g., in the X-direction and in the Y-direction) ends of the first microelectronic device structure 100. The second conductive contact exit regions 154 may comprise locations of the first microelectronic device structure 100 at which the conductive pillar structures 126 exit the first microelectronic device structure 100 and electrically connect to a second microelectronic device structure (e.g., second microelectronic device structure 200 (FIG. 2A)). Accordingly, the first conductive contact exit regions 152 and the second conductive contact exit regions 154 may comprise locations defining lateral boundaries within which the respective first conductive contact structures 122 and the conductive pillar structures 126 laterally (e.g., in the X-direction, in the Y-direction) and vertically (e.g., in the Z-direction) extend and contact conductive structures associated with a second microelectronic device structure (e.g., the second microelectronic device structure 200 (FIG. 2B)).

The peripheral regions 150 may further include so-called "socket regions" 115 laterally (e.g., in the Y-direction) neighboring the staircase structures 130 of the stack structure 125 in a direction opposite the first conductive contact exit regions 152. In some embodiments, the socket regions 115 laterally (e.g., in the Y-direction) between staircase structure 130 of laterally neighboring stack structures 125. As will be described herein, the socket regions 115 may be configured to include one or more conductive contact structures to facilitate conductively coupling portions of the first microelectronic device structure 100 to portions of a second microelectronic device structure (e.g., second microelectronic device structure 200 (FIG. 2B)). In some embodiments, the socket regions 115 may electrically couple circuitry of the first base structure 102 to BEOL structures of a second microelectronic device structure (e.g., the second microelectronic device structure 200 (FIG. 2A)).

FIG. 1B is a simplified partial cross-sectional view of the first microelectronic device structure 100 taken through section line B-B of FIG. 1A. The first microelectronic device structure 100 may include a first base structure 102. The first base structure 102 may include a semiconductive structure (e.g., a semiconductive wafer), or a base semiconductive material on a support structure or construction upon which additional materials and structures of the first microelectronic device structure 100 are formed. For example, the first base structure 102 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 102 comprises a silicon wafer. In addition, the first base structure 102 may include different layers, structures, devices, and/or regions formed therein and/or thereon. For example, the first base structure 102 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, and various chip/deck control circuitry. The devices and circuitry included in the first base structure 102 may employ different conventional conductive metal-oxide-semiconductor (CMOS) devices (e.g., conventional CMOS inverters, conventional CMOS NAND gates, conventional CMOS transmission pass gates, etc.), which are not described in detail herein.

In some embodiments, the first base structure 102 comprises conductively doped regions and undoped regions. The conductively doped regions may, for example, be employed as source regions and drain regions for transistors within the first base structure 102 and the undoped regions may, for example, be employed as channel regions for the transistors. In some embodiments, the first base structure 102 comprises a source structure and may comprise, for example, one or more conductive materials, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first base structure 102 comprises conductively-doped silicon.

With continued reference to FIG. 1B, each of the storage devices 114 may include a first electrode 140 (also referred to herein as an "outer electrode," "a first electrode plate," or a "first node"), a second electrode 142 (also referred to herein as an "inner electrode," "a second electrode plate," or a "second node"), and a dielectric material 144 between the first electrode 140 and the second electrode 142. In some such embodiments, the storage devices 114 individually comprise capacitors. However, the disclosure is not so limited and in other embodiments, the storage devices 114 may each individually comprise other structures, such as, for example, phase change memory (PCM), resistance random-access memory (RRAM), conductive-bridging random-access memory (conductive bridging RAM), or another structure for storing a logic state.

The first electrode 140 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the first electrode 140 comprises titanium nitride.

The second electrode 142 may be formed of and include conductive material. In some embodiments, the second electrode 142 comprises one or more of the materials described above with reference to the first electrode 140. In some embodiments, the second electrode 142 comprises substantially the same material composition as the first electrode 140.

The dielectric material 144 may be formed of and include one or more of silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), or a high-k dielectric material.

The second electrode 142 may be in electrical communication with a conductive structure 146. The conductive structure 146 may be formed of and include conductive material, such as one or more of the materials described above with reference to the second electrode 142. In some embodiments, the conductive structure 146 comprises substantially the same material composition as the second electrode 142. In other embodiments, the conductive structure 146 comprises a different material composition than the second electrode 142.

With continued reference to FIG. 1B, in some embodiments, the access devices 112 (one of which is illustrated in FIG. 1B in box 111) each individually include a source material 148, a drain material 149, and a channel material 151 laterally (e.g., in the Y-direction) between the source material 148 and the drain material 149. The source material 148 and the drain material 149 may each individually comprise a semiconductive material (e.g., polysilicon) doped with at least one N-type dopant, such as one or more of arsenic ions, phosphorous ions, and antimony ions. In other embodiments, the source material 148 and the drain material 149 each individually comprise a semiconductive material doped with at least one P-type dopant, such as boron ions.

In some embodiments, the channel material 151 comprises a semiconductive material (e.g., polysilicon) doped with at least one of at least one N-type dopant and at least one P-type dopant. In some embodiments, the channel material 151 is doped with one of at least one N-type dopant and at least one P-type dopant and each of the source material 148 and the drain material 149 are each individually doped with the other of the at least one N-type dopant and the at least one P-type dopant.

In some embodiments, the source material 148 of each access device 112 is electrically connected to the conductive plate 116 and the drain material 149 of each access device 112 is electrically connected to a laterally (e.g., in the Y-direction) neighboring storage device 114, such as to the first electrode 140 of the laterally neighboring storage device 114.

The conductive structures 120 may extend laterally (e.g., in the X-direction) as lines and may be each configured to be operably coupled to a vertically (e.g., in the Z-direction) neighboring channel material 151 of the access devices 112. In other words, a conductive structure 120 may be configured to operably couple to a vertically (e.g., in the Z-direction) neighboring access device 112.

The channel material 151 may be separated from the conductive structures 120 by a dielectric material 155, which may also be referred to herein as a "gate dielectric material." The dielectric material 155 may be formed of and include insulative material. By way of non-limiting example, the dielectric material 155 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride (Si$_3$N$_4$)), an oxynitride (e.g., silicon oxynitride), another gate dielectric material, a dielectric carbon nitride material (e.g., silicon carbon nitride (SiCN)), or a dielectric carboxynitride material (e.g., silicon carboxynitride (SiOCN)).

In some embodiments, insulative structures 104 and additional insulative structures 106 may vertically (e.g., in the Z-direction) intervene between vertically neighboring access devices 112 and vertically neighboring storage devices 114. The additional insulative structures 106 may laterally (e.g., in the Y-direction) neighbor each of the conductive structures 120.

The insulative structures 104 may be formed of and include insulative material. In some embodiments, the insulative structures 104 may each individually be formed of and include, for example, an insulative material, such as one or more of an oxide material (e.g., silicon dioxide (SiO$_2$), phosphosilicate glass, borosilicate glass, borophosphosilicate glass, fluorosilicate glass, titanium dioxide (TiO$_2$), hafnium oxide (HfO$_2$), zirconium dioxide (ZrO$_2$), hafnium dioxide (HfO$_2$), tantalum oxide (TaO$_2$), magnesium oxide (MgO), aluminum oxide (Al$_2$O$_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 exhibits a substantially homogeneous distribution of insulative material. In additional embodiments, at least one of the insulative structures 104 exhibits a substantially heterogeneous distribution of at least one insulative material. The insulative structures 104 may, for example, be formed of and include a stack (e.g., laminate) of at least two different insulative materials. The insulative structures 104 may each be substantially planar, and may each individually exhibit a desired thickness.

The additional insulative structures 106 may be formed of and include an insulative material that is different than, and that has an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

With continued reference to FIG. 1B, the conductive pillar structures 126 (only one of which is illustrated in the cross-sectional view of FIG. 1B) may vertically (e.g., in the Z-direction) extend into the vertical stack of memory cells 110 and may be in electrical communication with the access devices 112 of the vertical stack of memory cells 110. In some embodiments, the conductive pillar structures 126 each vertically extend through the access devices 112 and are in electrical communication with, for example, the source material 148 of the access devices 112. In some embodiments, the conductive pillar structures 126 are in electrical communication with the first base structure 102.

In some embodiments, the first microelectronic device structure 100 includes a metallization structure 160 formed of and including conductive material. As will be described herein, the metallization structure 160 (not illustrated in FIG. 1A for clarity and ease of understanding the description) may be coupled to a global digit line (e.g., a global conductive structure 168 (FIG. 1G)) and may be configured to selectively provide power (e.g., a current) to the conductive pillar structure 126 through, for example, a vertically (e.g., in the Z-direction) nearest one of the access devices 112 that is in contact with the metallization structure 160. In some embodiments, the metallization structure 160 may be operably coupled to a vertically (e.g., in the Z-direction) uppermost access device 112 configured for operably coupling the metallization structure 160 to the conductive pillar structure 126. The vertically uppermost access device 112 may be referred to herein as a multiplexer 158 (illustrated in broken lines in FIG. 1B). The multiplexer 158 may comprise a select device for operably coupling a conductive pillar structure 126 to which is it coupled to a global digit line through the metallization structure 160.

In some embodiments, the metallization structure 160 comprises a material exhibiting a relatively low RC value to facilitate an increased speed of data transmission. In some embodiments, the metallization structure 160 comprises copper. In other embodiments, the metallization structure 160 comprises tungsten.

In some embodiments, an access device 112 vertically (e.g., in the Z-direction) neighboring the multiplexer 158 may comprise a transistor 162 (illustrated in broken lines in FIG. 1B) configured to be in electrical communication with the conductive structure 146 through an additional conductive structure 164.

The additional conductive structure 164 may comprise one or more of the conductive materials described above with reference to the metallization structure 160. In some embodiments, the additional conductive structure 164 comprises the same material composition as the metallization structure 160. In some embodiments, the additional conductive structure 164 comprises copper.

Figure 1C:
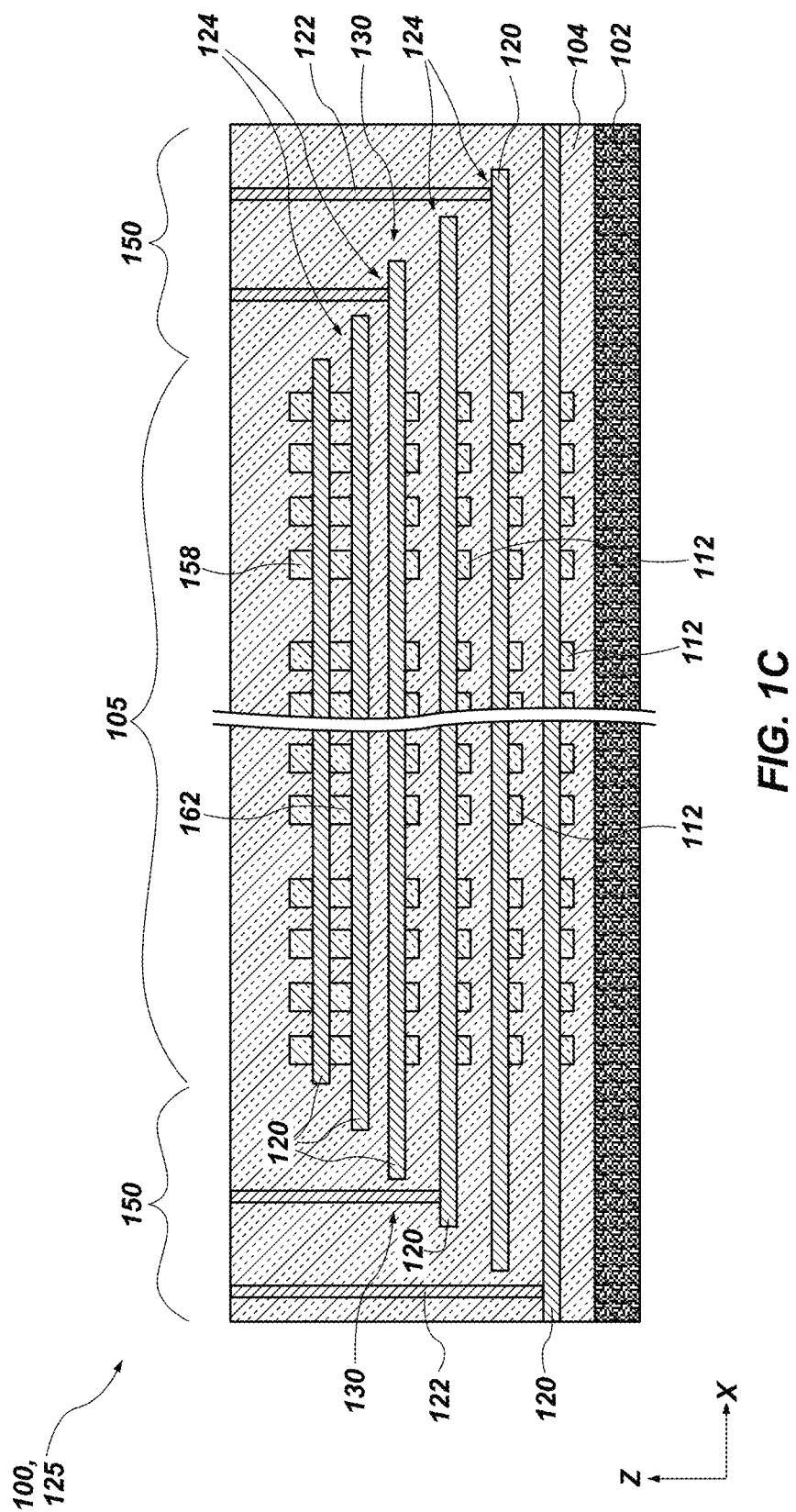
Figure 1D:
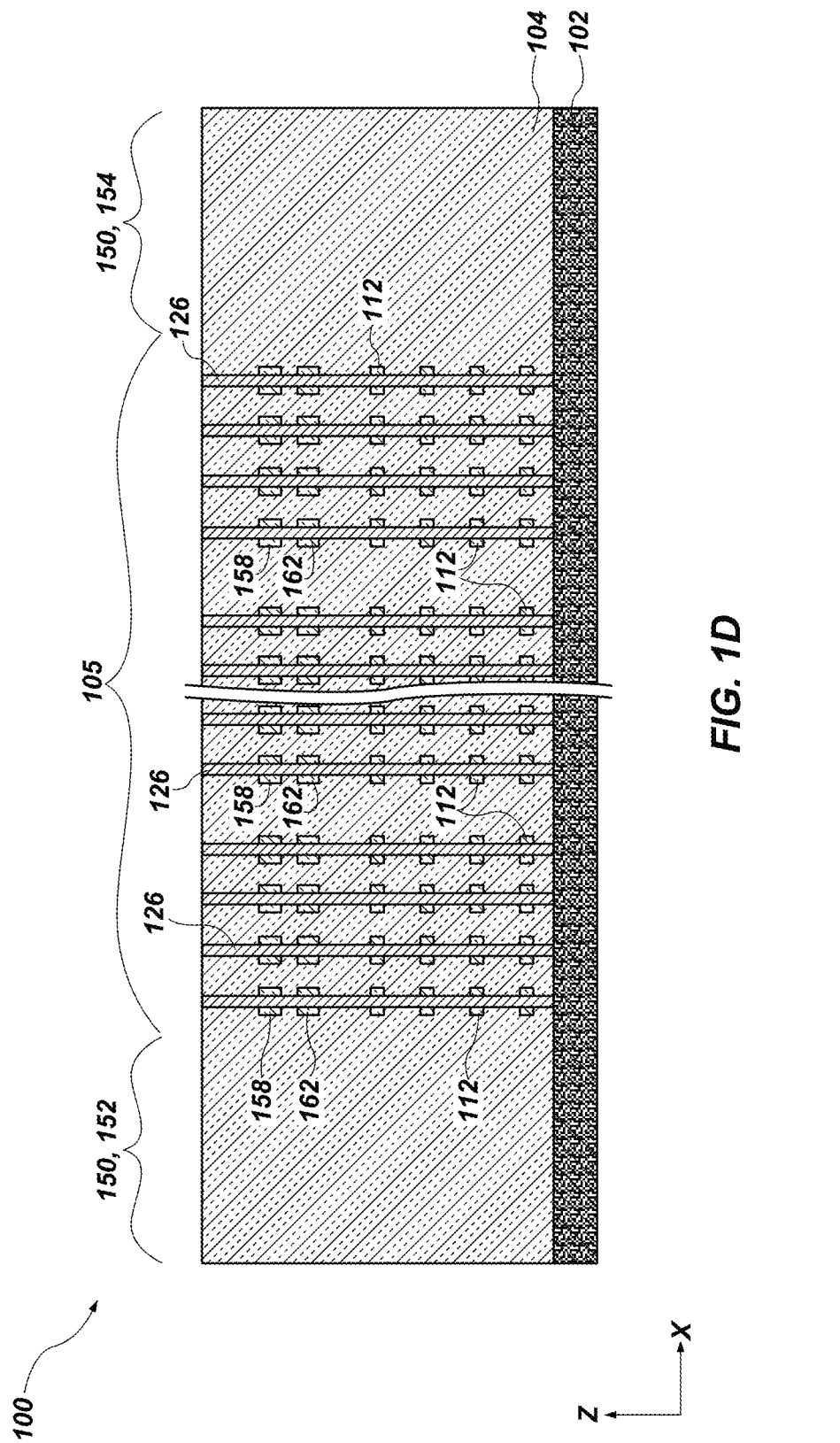

FIG. 1C is a simplified partial cross-sectional view of the first microelectronic device structure 100 of FIG. 1A taken through section line C-C of FIG. 1A and FIG. 1D is a simplified partial cross-sectional view of the first microelectronic device structure 100 of FIG. 1A taken through section line D-D of FIG. 1A. The partial cross-sectional view of FIG. 1C illustrates the stack structure 125 and the staircase structures 130 at lateral (e.g., in the X-direction) ends of the stack structure 125.

Although FIG. 1C and FIG. 1D illustrate that the staircase structures 130 include only a particular number of steps 124, the disclosure is not so limited. In other embodiments, the staircase structures 130 each individually include a desired quantity of the steps 124, such as within a range from thirty-two (32) of the steps 124 to two hundred fifty-six (256) of the steps 124. In some embodiments, the staircase structures 130 each individually include sixty-four (64) of the steps 124. In other embodiments, the staircase structures 130 each individually include a different number of the steps 124, such as less than sixty-four (64) of the steps 124 (e.g., less than or equal to sixty (60) of the steps 124, less than or equal to fifty (50) of the steps 124, less than about forty (40) of the steps 124, less than or equal to thirty (30) of the steps 124, less than or equal to twenty (20) of the steps 124, less than or equal to ten (10) of the steps 124); or greater than sixty-four (64) of the steps 124 (e.g., greater than or equal to seventy (70) of the steps 124, greater than or equal to one hundred (100) of the steps 124, greater than or equal to about one hundred twenty-eight (128) of the steps 124, greater than two hundred fifty-six (256) of the steps 124).

With reference to FIG. 1D, the conductive pillar structures 126 may vertically (e.g., in the Z-direction) extend through levels of the insulative structure 104 and the access devices 112 within the array region 105. The conductive pillar structures 126 may be in electrical communication with the access devices 112, the multiplexer 158, and the transistor 162.

Figure 1E:
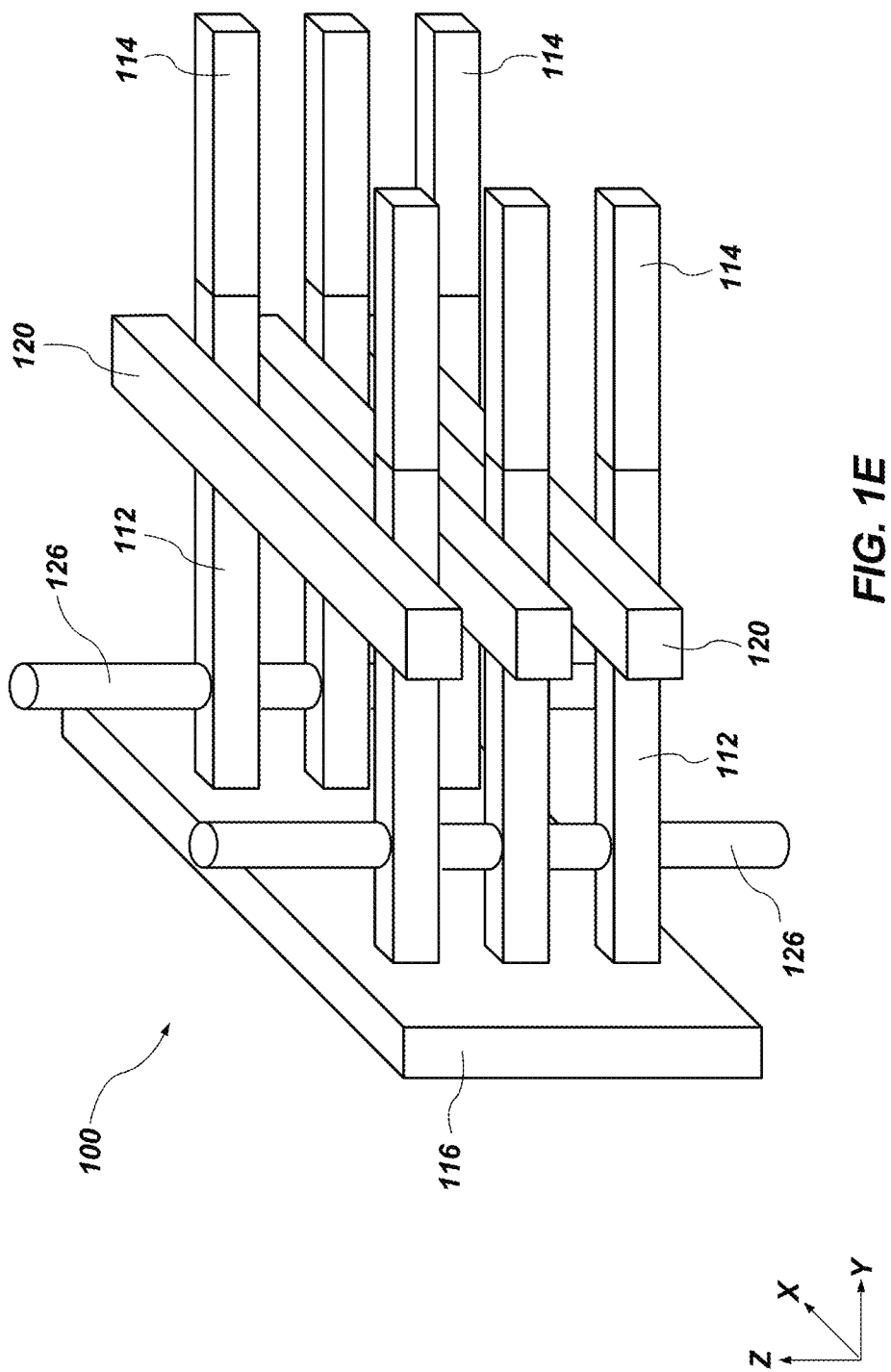

FIG. 1E is a simplified partial perspective view illustrating a portion of the first microelectronic device structure 100. FIG. 1E illustrates the relative orientation of the conductive plate 116, the first conductive structures 120, the conductive pillar structures 126, the access devices 112, and the storage devices 114 is illustrated. Although FIG. 1E does not illustrate the staircase structures 130, it will be understood that the conductive pillar structures 126 terminate at the staircase structures 130.

Figure 1F:
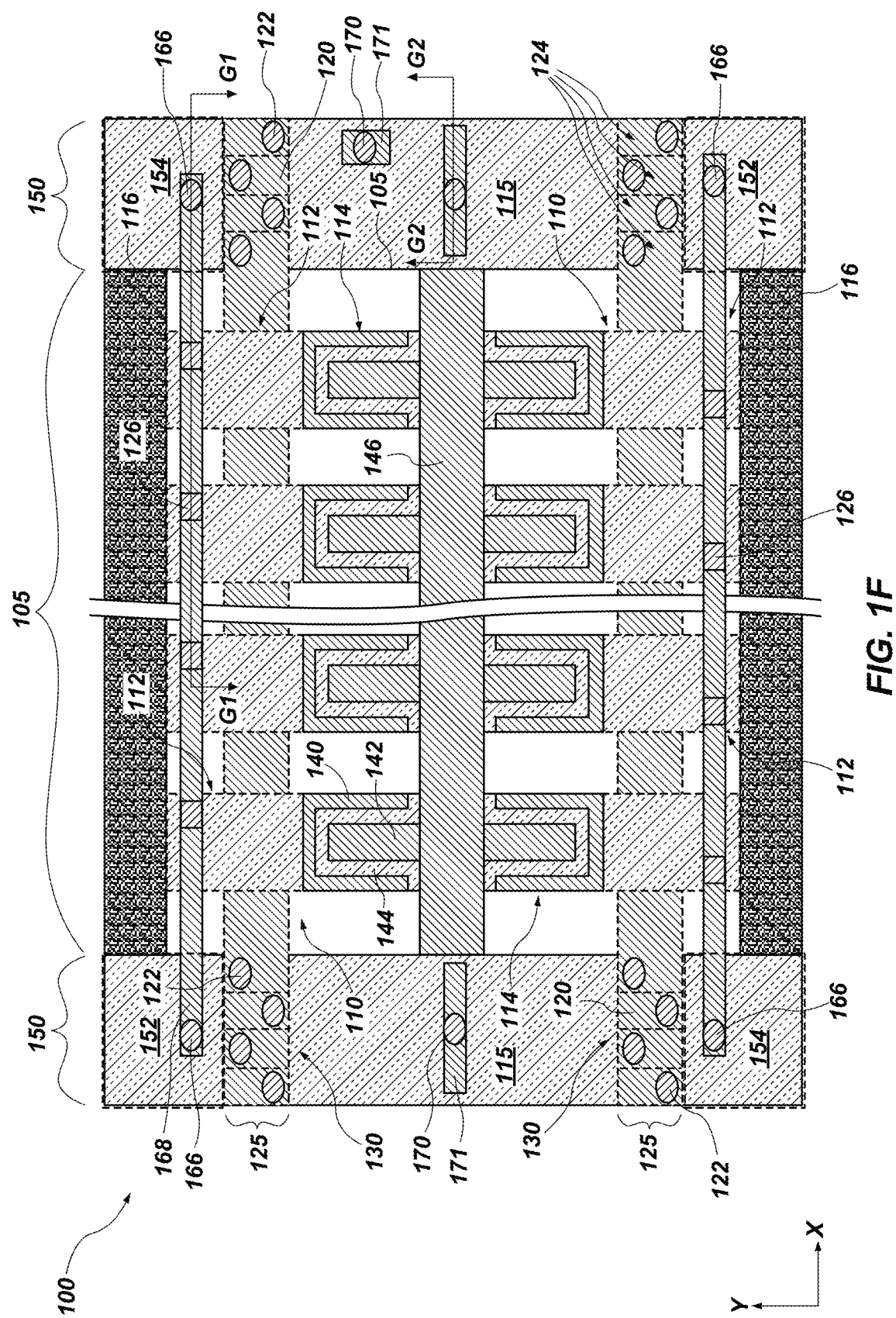
Figure 1G:
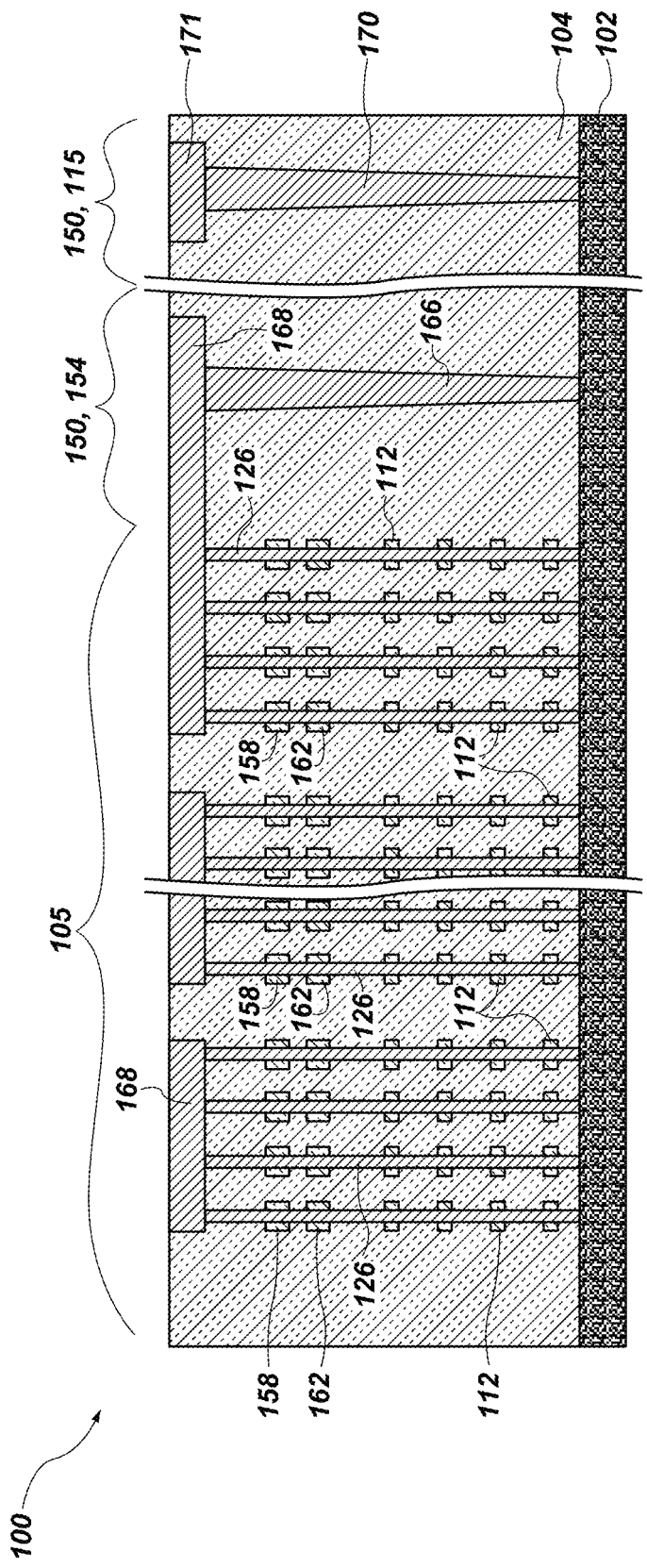

FIG. 1F is a simplified partial top-down view of the first microelectronic device structure 100 and FIG. 1G is a simplified partial cross-sectional view of the first microelectronic device structure 100 taken through section line G1-G1 of FIG. 1F and section line G2-G2 of FIG. 1F. Although the cross-section of the first microelectronic device structure taken through section line G1-G1 and section line G2-G2 illustrated in FIG. 1G, it will be understood that the cross-sections of such portions of the first microelectronic device structure 100 are not in the same plane.

With collective reference to FIG. 1F and FIG. 1G, a first conductive interconnect structure 166 may be formed through the insulative structure 104 within the peripheral region 150, such as within the second conductive contact exit regions 154; and global conductive structures 168 may be formed vertically (e.g., in the Z-direction) over and in electrical communication with the conductive pillar structures 126 and the first conductive interconnect structures 166. In some embodiments, each of the global conductive structures 168 are in electrical communication with more than one (e.g., two, three, four, six, eight) of the conductive pillar structures 126.

Each of the first conductive interconnect structure 166 and the global conductive structure 168 may independently be formed of and include conductive material. In some embodiments, the first conductive interconnect structure 166 and the global conductive structures 168 individually comprise tungsten. In other embodiments, each of the first conductive interconnect structure 166 and the global conductive structures 168 individually comprise copper.

With continued reference to FIG. 1F and FIG. 1G, an additional conductive interconnect structure 170 may be formed through the insulative structure 104 within the socket regions 115 region of the peripheral region 150 and a first conductive pad structure 171 may be formed in electrical communication with the additional conductive interconnect structure 170.

The additional conductive interconnect structure 170 and the first conductive pad structure 171 may individually be formed of and comprise conductive material. In some embodiments, the additional conductive interconnect structure 170 and the first conductive pad structure 171 individually comprise tungsten. In other embodiments, the additional conductive interconnect structure 170 and the first conductive pad structure 171 individually comprise copper.

Figure 1H:
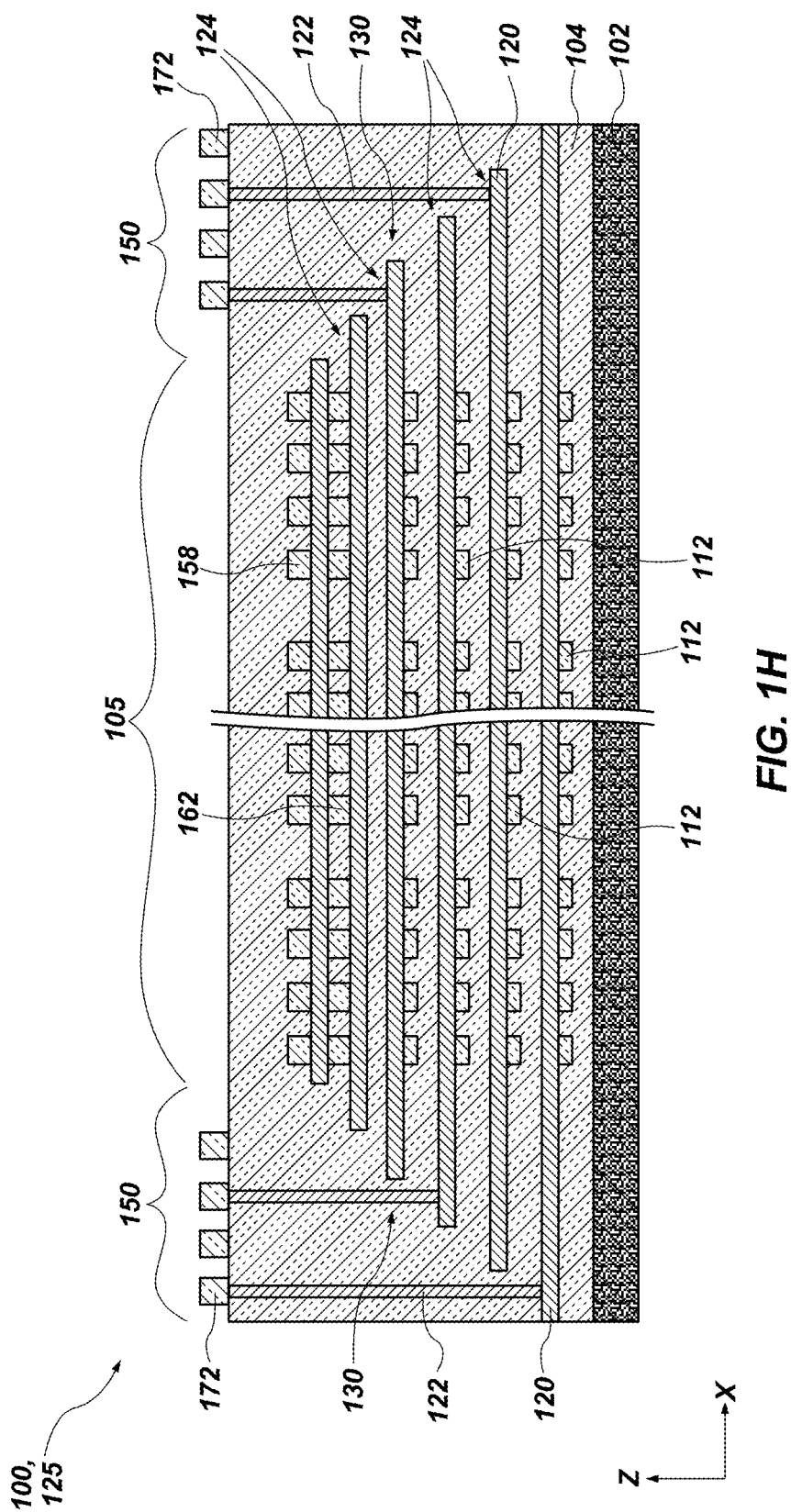
Figure 1I:
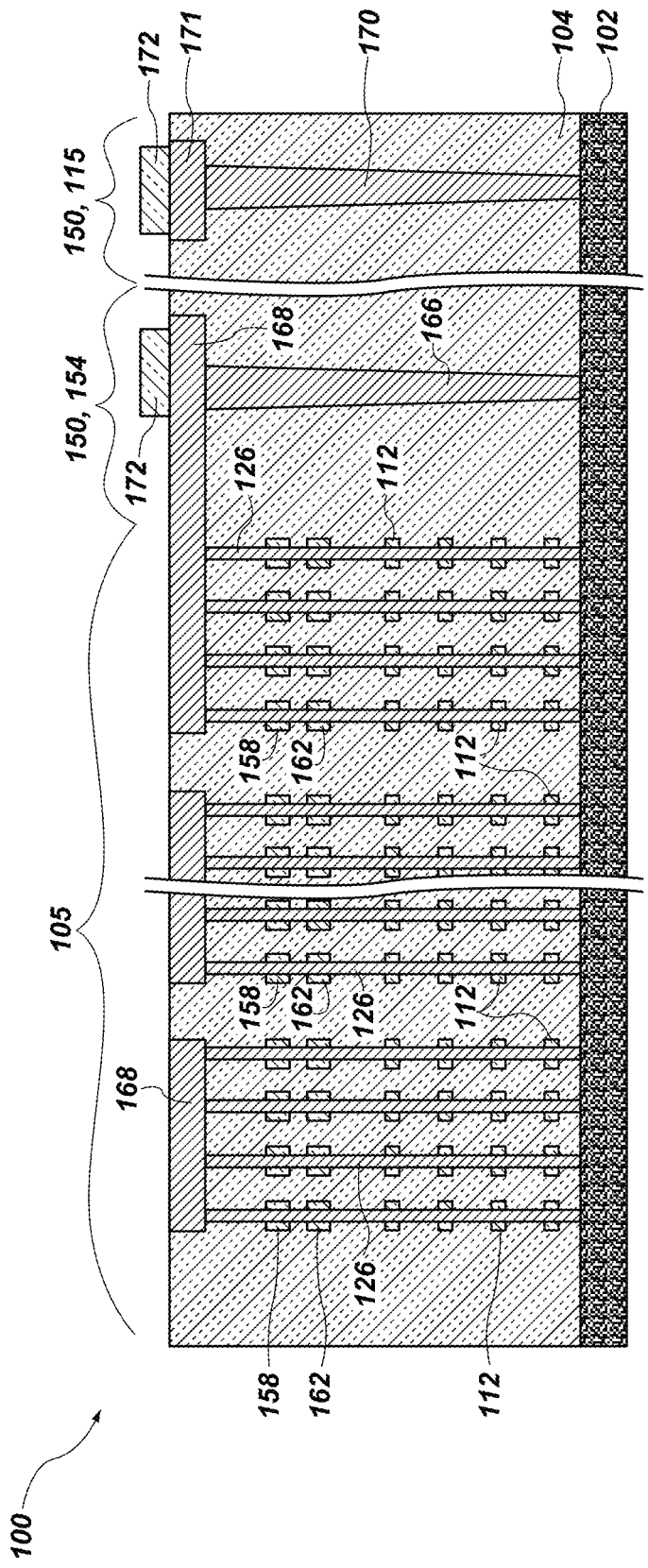

FIG. 1H is a simplified partial cross-sectional view of the first microelectronic device structure 100 illustrating the same cross-section as FIG. 1C and FIG. 1I is a simplified partial cross-sectional view of the first microelectronic device structure 100 illustrating the same cross-section as FIG. 1G. With collective reference to FIG. 1H and FIG. 1I, first sacrificial structures 172 may be formed vertically (e.g., in the Z-direction) over and in contact with the first conductive contact structures 122 in the peripheral regions 150, the global conductive structures 168 in the peripheral region 150 (e.g., in the second conductive contact exit region 154), and the first conductive pad structure 171 in the socket region 115.

As will be described herein, the first sacrificial structures 172 may be used to form conductive structures (e.g., second conductive pad structures 264 (FIG. 2H), third conductive pad structures 268 (FIG. 2H), fourth conductive pad structures 272 (FIG. 2I)) for forming an electrical connection individually between the first conductive contact structures 122, the global conductive structures 168, and the first conductive pad structures 171 and one or more additional conductive structures.

The first sacrificial structures 172 may be formed of and include a sacrificial material. The first sacrificial structures 172 may exhibit an etch selectivity with respect to the insulative structure 104, the first conductive contact structures 122, the global conductive structures 168, and the first conductive pad structure 171. In some embodiments, the first sacrificial structures 172 comprise a nitride material, such as silicon nitride. In other embodiments, the first sacrificial structures 172 comprise polysilicon. However, the disclosure is not so limited and the first sacrificial structures 172 may comprise one or more different materials.

Figure 1J:
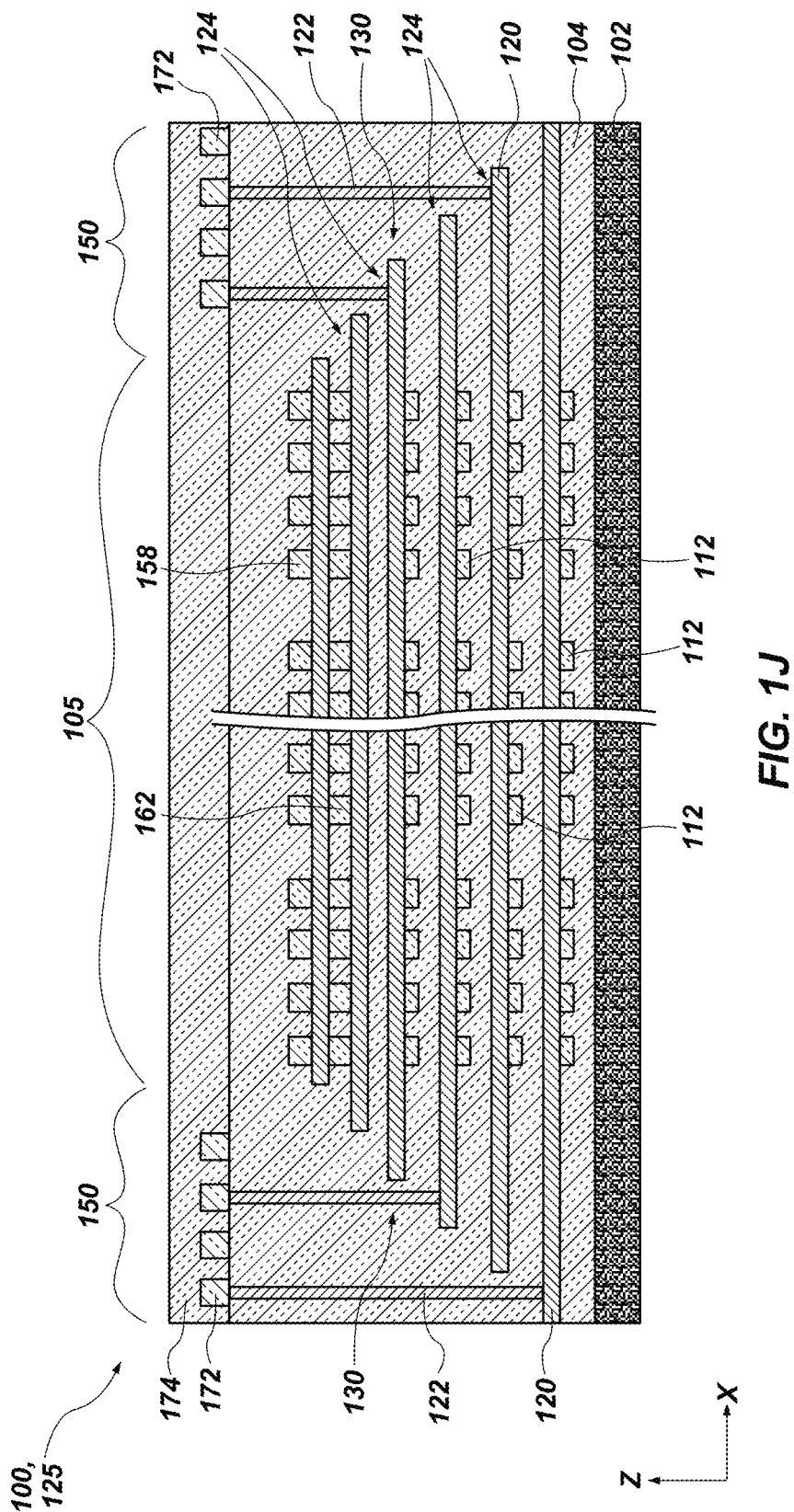
Figure 1K:
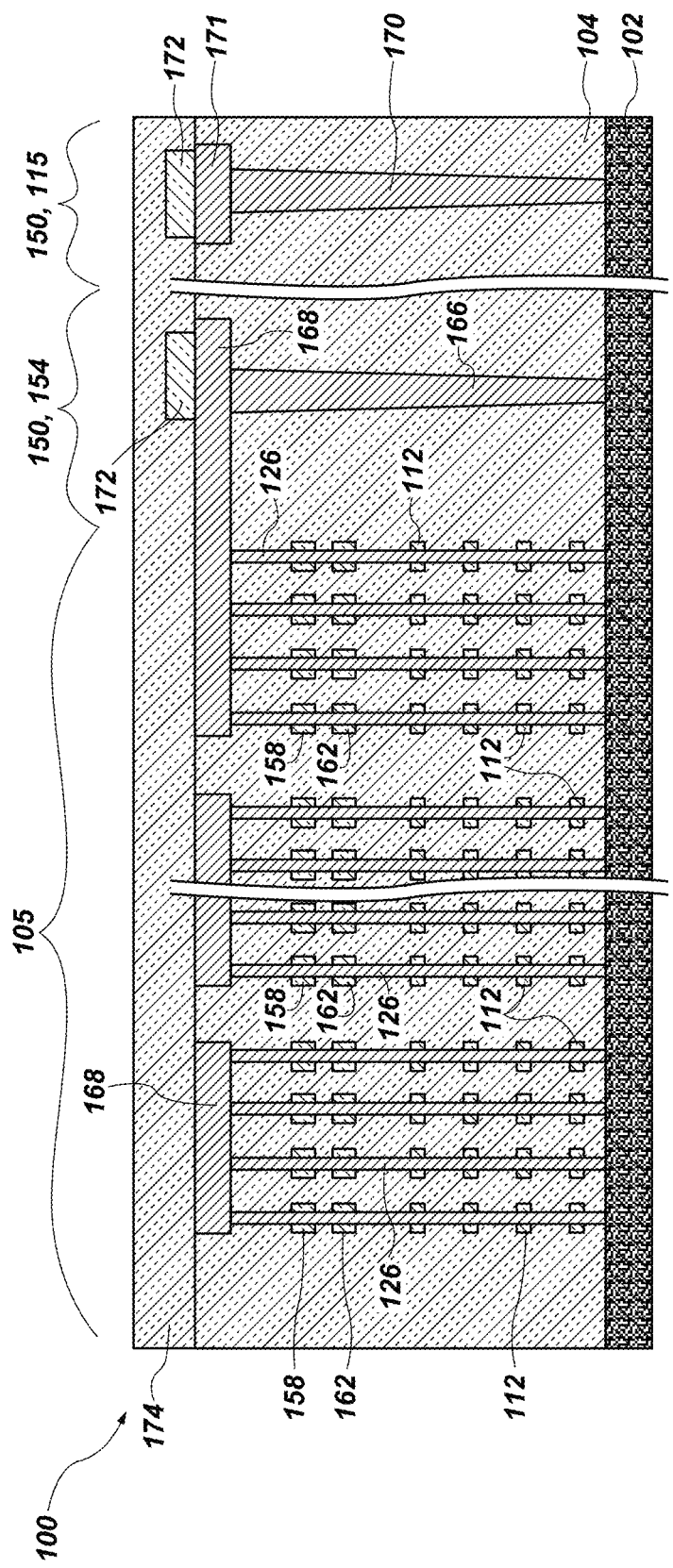

Referring collectively to FIG. 1J and FIG. 1K, which are simplified cross-sectional views of the first microelectronic device structure 100 illustrating the same cross-sectional views of FIG. 1H and FIG. 1I, respectively, a first oxide material 174 may be formed over the first microelectronic device structure 100, between laterally neighboring first sacrificial structures 172 and vertically (e.g., in the Z-direction) over the first sacrificial structures 172.

The first oxide material 174 may be formed of and include insulative material. In some embodiments, the first oxide material 174 comprises one or more of the materials described above with reference to the insulative structure 104. In some embodiments, the first oxide material 174 comprises substantially the same material composition as the insulative structures 104. In some embodiments, the first oxide material 174 comprises silicon dioxide.

After forming the first oxide material 174, the first oxide material 174 may be exposed to a chemical mechanical planarization (CMP) process to form a substantially planar upper (e.g., in the Z-direction) surface of the first oxide material 174. In some embodiments, the CMP process is configured to stop on the first oxide material 174 without exposing vertically (e.g., in the Z-direction) upper surfaces of the first sacrificial structures 172. In other embodiments, the first oxide material 174 is exposed to the CMP process until upper surfaces of the first sacrificial structures 172 are exposed. After exposing the upper surfaces of the first sacrificial structures 172, an additional oxide material may be formed over the first sacrificial structures 172 and the first oxide material 174 between laterally neighboring first sacrificial structures 172 by, for example, a conformal deposition process (e.g., ALD, CVD).

FIG. 2A through FIG. 2K illustrate a method of forming a microelectronic device comprising the first microelectronic device structure 100 (FIG. 1K) attached to a second microelectronic device structure, in accordance with embodiments of the disclosure.

Figure 2A:
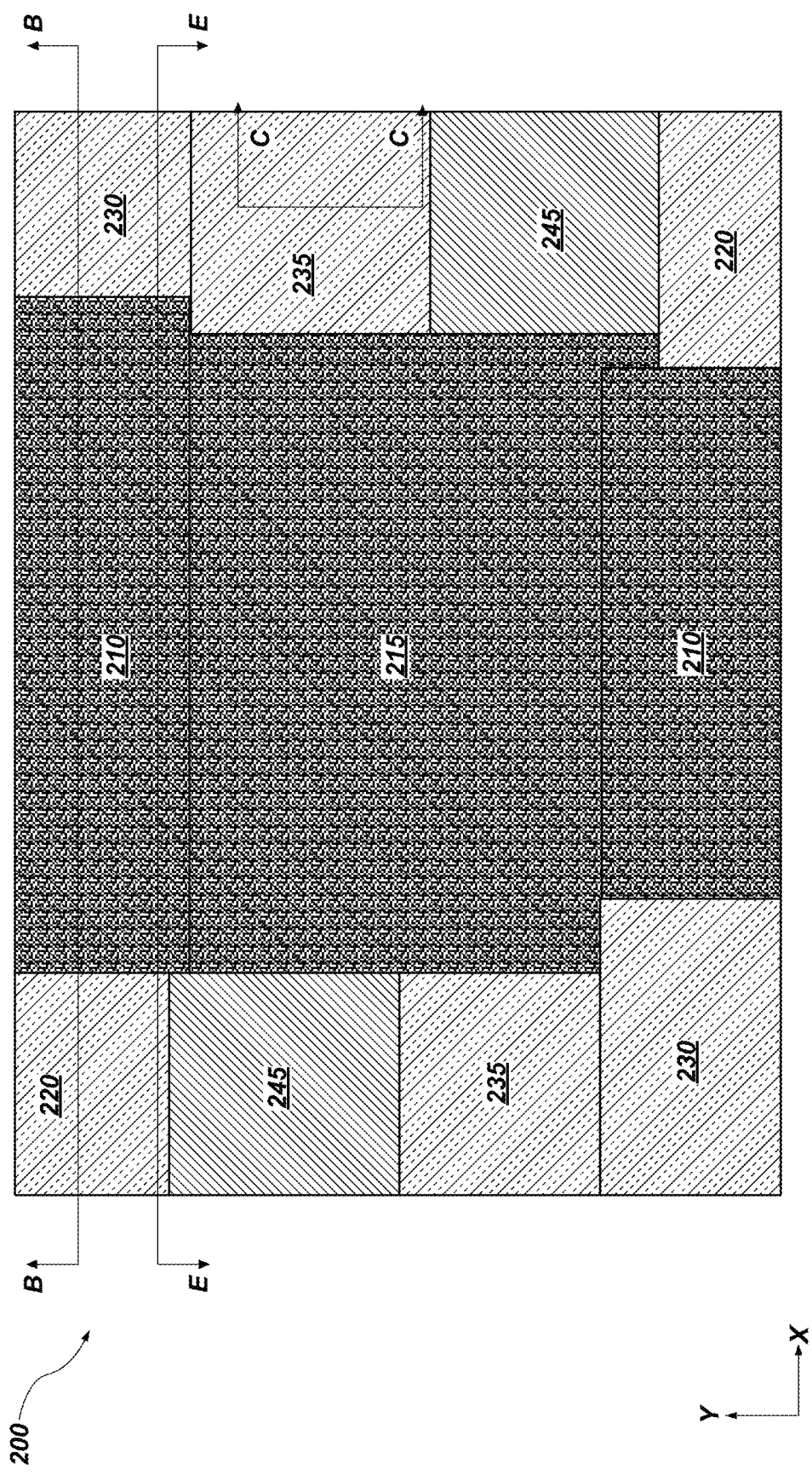
FIG. 2A through FIG. 2K include a simplified partial top-down view (FIG. 2A) and simplified partial cross-sectional views (FIG. 2B through FIG. 2K) illustrating a method of forming a microelectronic device, in accordance with embodiments of the disclosure.
Figure 2B:
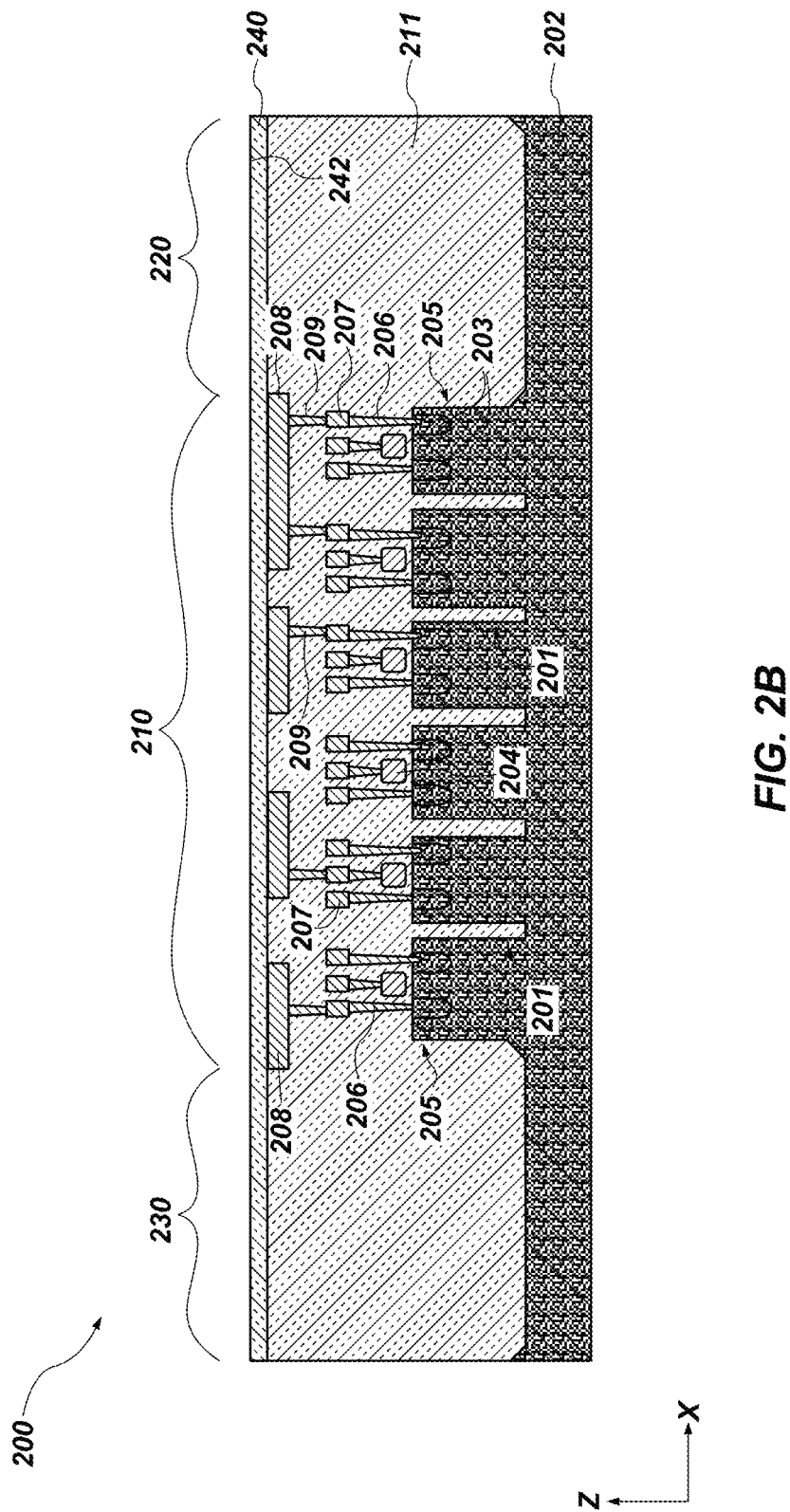
Figure 2C:
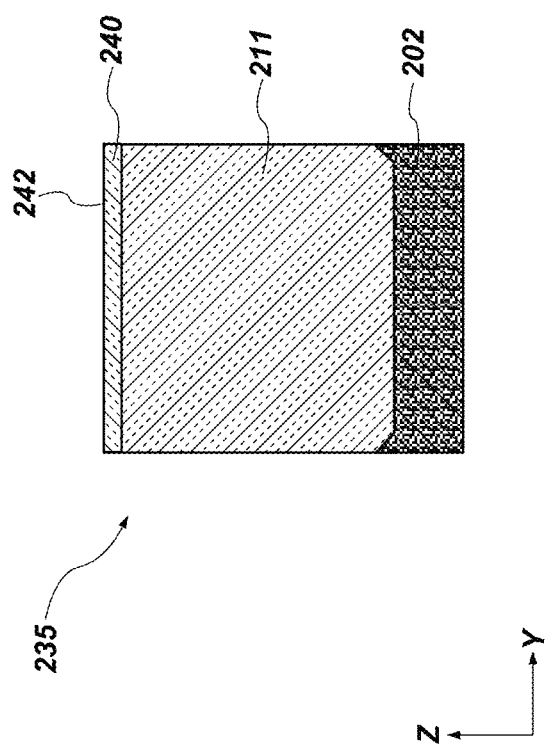

FIG. 2A is a simplified partial top-down view of a second microelectronic device structure 200, FIG. 2B is a simplified partial cross-sectional view of the second microelectronic device structure 200 taken through section line B-B of FIG. 2A, and FIG. 2C is a simplified partial cross-sectional view of the second microelectronic device structure 200 taken through section line C-C of FIG. 2A. With reference to FIG. 2A, in some embodiments, the second microelectronic device structure 200 exhibits substantially the same lateral cross-sectional area as the first microelectronic device structure 100 (FIG. 1F). The second microelectronic device structure 200 may also be referred to herein as a second die or a second wafer.

The second microelectronic device structure 200 may include one or more control logic devices (e.g., CMOS devices) and circuitry. In some embodiments, the second microelectronic device structure 200 includes so-called high performance control logic devices. For example, the circuitry of the second microelectronic device structure 200 may be configured to operate at applied voltages less than or equal to (e.g., less than) about 1.4 volts (V), such as within a range of from about 0.7 V to about 1.4 V (e.g., from about 0.7 V to about 1.3 V, from about 0.7 V to about 1.2 V, from about 0.9 V to about 1.2 V, from about 0.95 V to about 1.15 V, or about 1.1 V).

With reference to FIG. 2A, the second microelectronic device structure 200 may include one or more sense amplifier (SA) regions 210 including one or more sense amplifier devices (e.g., equalization (EQ) amplifiers, isolation (ISO) amplifiers, NMOS sense amplifiers (NSAs), PMOS sense amplifiers (PSAs)), one or more first conductive contact exit regions 220, one or more second conductive contact exit regions 230, one or more socket regions 235, one or more sub-word line driver regions 245 including one or more sub-word line driver devices, and one or more additional regions 215. Each of the sense amplifier regions 210, the first conductive contact exit regions 220, the second conductive contact exit regions 230, the socket regions 235, and the sub-word line driver regions 245 are illustrated in broken lines in FIG. 2A.

In some embodiments, the first conductive contact exit regions 220 and the second conductive contact exit regions 230 laterally (e.g., in the X-direction) neighbor the sense amplifier regions 210. In some embodiments, a first conductive contact exit region 220 laterally neighbors a first lateral (e.g., in the X-direction) side of the sense amplifier region 210 and a second conductive contact exit region 230 laterally (e.g., in the X-direction) neighbors a second, opposite lateral side of the sense amplifier region 210. In some embodiments, the sense amplifier regions 210 may be located on opposing lateral (e.g., in the Y-direction) ends of the second microelectronic device structure 200. In some embodiments, the location of the sense amplifier regions 210 on the second microelectronic device structure 200 correspond to the location of the global conductive structures 168 (FIG. 1F) and the conductive pillar structures 126 (FIG. 1F) of the first microelectronic device structure 100 (FIG. 1F). As will be described herein, the sense amplifier region 210 may include circuitry that is in electrical communication with the conductive pillar structures 126.

In some embodiments, the first conductive contact exit regions 220 may be located at opposite corners of the second microelectronic device structure 200. In some such embodiments, the first conductive contact exit regions 220 may be located substantially diagonal from each other. In some embodiments, the location of the first conductive contact exit regions 220 of the second microelectronic device structure 200 correspond to the locations of the first conductive contact exit regions 152 (FIG. 1F) of the first microelectronic device structure 100 (FIG. 1F).

The second conductive contact exit regions 230 may be located at the other opposite corners of the second microelectronic device structure 200. In some such embodiments, the second conductive contact exit regions 230 may be located substantially diagonal from each other. In some embodiments, the location of the second conductive contact exit regions 230 of the second microelectronic device structure 200 correspond to the locations of the second conductive contact exit regions 154 (FIG. 1F) of the first microelectronic device structure 100 (FIG. 1F).

The sub-word line driver regions 245 may laterally (e.g., in the Y-direction) neighbor the first conductive contact exit regions 220 and may be laterally between a first conductive contact exit region 220 and a socket region 235. In some embodiments, the location of the sub-word line driver regions 245 of the second microelectronic device structure 200 may correspond to the location of the staircase structures 130 (FIG. 1F) and the first conductive contact structures 122 (FIG. 1F) of the first microelectronic device structure 100 (FIG. 1F). In addition, the location of the socket regions 235 of the second microelectronic device structure 200 may correspond to the location of the socket regions 115 (FIG. 1F) and the first conductive pad structures 171 (FIG. 1F) of the first microelectronic device structure 100 (FIG. 1F).

In some embodiments, the location of the one or more additional regions 215 of the second microelectronic device structure 200 corresponds to the location of the array region 105 (FIG. 1F) of the first microelectronic device structure 100 (FIG. 1F).

As described above, the control logic devices of the second microelectronic device structure 200 may comprise high performance CMOS devices. By way of non-limiting example, in some embodiments, the one or more additional regions 215 include one or more (e.g., each) of voltage pumps (also referred to as charge pumps) (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, and various chip/deck control circuitry, block switches (e.g., configured and operated for selection of memory blocks of the array region 105 (FIG. 1F)), drivers (e.g., string drivers, column drivers), and select devices (e.g., row select devices, column select devices). In some embodiments, the one or more additional regions 215 further include various control circuitry associated with the array region 105. For example, the control devices of the one or more additional regions 215 may include logic for controlling the regulation of voltage references when biasing particular memory blocks of the array region 105 into a read or write state, or for generating row and column addresses.

As another non-limiting example, the control logic devices of the one or more additional regions 215 may include devices configured to control column operations for arrays (e.g., memory element array(s), access device array(s) within the array region 105 (FIG. 1F) of the first microelectronic device structure 100 (FIG. 1F)), such as one or more (e.g., each) of decoders (e.g., local deck decoders, column decoders), repair circuitry (e.g., column repair circuitry), memory test devices, array multiplexers (MUX), and error checking and correction (ECC) devices; control devices configured to control row operations for arrays (e.g., memory element array(s), access device array(s)) within the array region 105 of the first microelectronic device structure 100, such as one or more (e.g., each) of decoders (e.g., local deck decoders, row decoders), repair circuitry (e.g., row repair circuitry), memory test devices, MUX, ECC devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry. In some embodiments, the one or more additional regions 215 include drivers (e.g., one or more column drivers) but do not include word line drivers.

With reference to FIG. 2B, the sense amplifier regions 210 may each include transistor structures 205 separated from each other by isolation trenches 201 within a second base structure 202. The second base structure 202 (e.g., second semiconductive wafer) may include a base material or construction upon which additional materials and structures of the second microelectronic device structure 200 are formed. The second base structure 202 may comprise a semiconductive structure (e.g., a semiconductive wafer), or a base semiconductive material on a supporting structure. For example, the second base structure 202 may comprise a conventional silicon substrate (e.g., a conventional silicon wafer), or another bulk substrate comprising a semiconductive material. In some embodiments, the second base structure 202 comprises a silicon wafer. In addition, the second base structure 202 may include one or more layers, structures, and/or regions formed therein and/or thereon.

The transistor structures 205 may each include conductively doped regions 203 (e.g., source and drain regions) and gate structures 204 laterally extending between the conductively doped regions 203. The conductively doped regions 203 may each individually be doped with one or more semiconductive materials, such as at least one N-type dopant, or at least one P-type dopant, as described above with reference to the source material 148 (FIG. 1B) and the drain material 149 (FIG. 1B).

The conductively doped regions 203 and the gate structures 204 may be electrically coupled to conductive interconnect structures 206. The conductive interconnect structures 206 may be formed of and include conductive material. In some embodiments, the conductive interconnect structures 206 individually comprise tungsten.

The conductive interconnect structures 206 may individually electrically couple the conductively doped regions 203 and the gate structures 204 to one or more routing structures 207 and pad structures 208. The pad structures 208 may be in electrical communication with the routing structures 207 by means of interconnect structures 209.

The conductive interconnect structures 206, the routing structures 207, the pad structures 208, and the interconnect structures 209 may individually be formed of and include conductive material. In some embodiments, the conductive interconnect structures 206, the routing structures 207, the pad structures 208, and the interconnect structures 209 individually comprise tungsten. In other embodiments, the conductive interconnect structures 206, the routing structures 207, the pad structures 208, and the interconnect structures 209 individually comprise copper.

The second microelectronic device structure 200 may include an insulative material 211 between the transistor structures 205 and electrically isolating different portions of the transistor structures 205, the conductive interconnect structures 206, the routing structures 207, and the pad structures 208. In some embodiments, the insulative material 211 may comprise an isolation region (e.g., a shallow trench isolation region) in contact with the second base structure 202, such as at regions laterally neighboring the transistors structures 205 within the first conductive contact exit regions 220 and the second conductive contact regions 230.

The insulative material 211 may comprise one or more of the materials described above with reference to the insulative structures 104 (FIG. 1B). In some embodiments, the insulative material 211 comprises substantially the same material composition as the insulative structures 104. In other embodiments, the insulative material 211 comprises a different material composition than the insulative structures 104. In some embodiments, the insulative material comprises silicon dioxide.

In some embodiments, after forming the transistor structures 205, the conductive interconnect structures 206, the routing structures 207, and the pad structures 208, a second oxide material 240 may be formed vertically (e.g., in the Z-direction) over components of the second microelectronic device structure 200, such as over the insulative material 211 and the pad structures 208. A vertically upper surface 242 of the second oxide material 240 may be exposed. The second oxide material 240 may be formed of and include one or more of the materials described above with reference to the insulative structures 104 (FIG. 1K). In some embodiments, the second oxide material 240 comprises substantially the same material composition as the insulative structures 104. In some embodiments the second oxide material 240 comprises substantially the same material composition as the insulative material 211. In some embodiments, the second oxide material 240 comprises a different material composition than the insulative material 211. In some embodiments, the second oxide material 240 comprises silicon dioxide.

Although FIG. 2B illustrates the transistor structures 205 in the sense amplifier region 210, it will be understood that other regions of the second microelectronic device structure 200 may include the transistor structures 205. For example, one or more of (e.g., each of) the socket regions 235, the sub-word line driver regions 245, and the one or more additional regions 215 may include the transistor structures 205.

FIG. 2C is a simplified partial cross-sectional view of the second microelectronic device structure 200 taken through section line C-C of FIG. 2A. With collective reference to FIG. 2B and FIG. 2C, the socket regions 235 may each include recessed portions wherein an upper surface of the second base structure 202 is vertically (e.g., in the Z-direction) lower than the upper surface of the second base structure 202 in the sense amplifier regions 210.

Figure 2D:
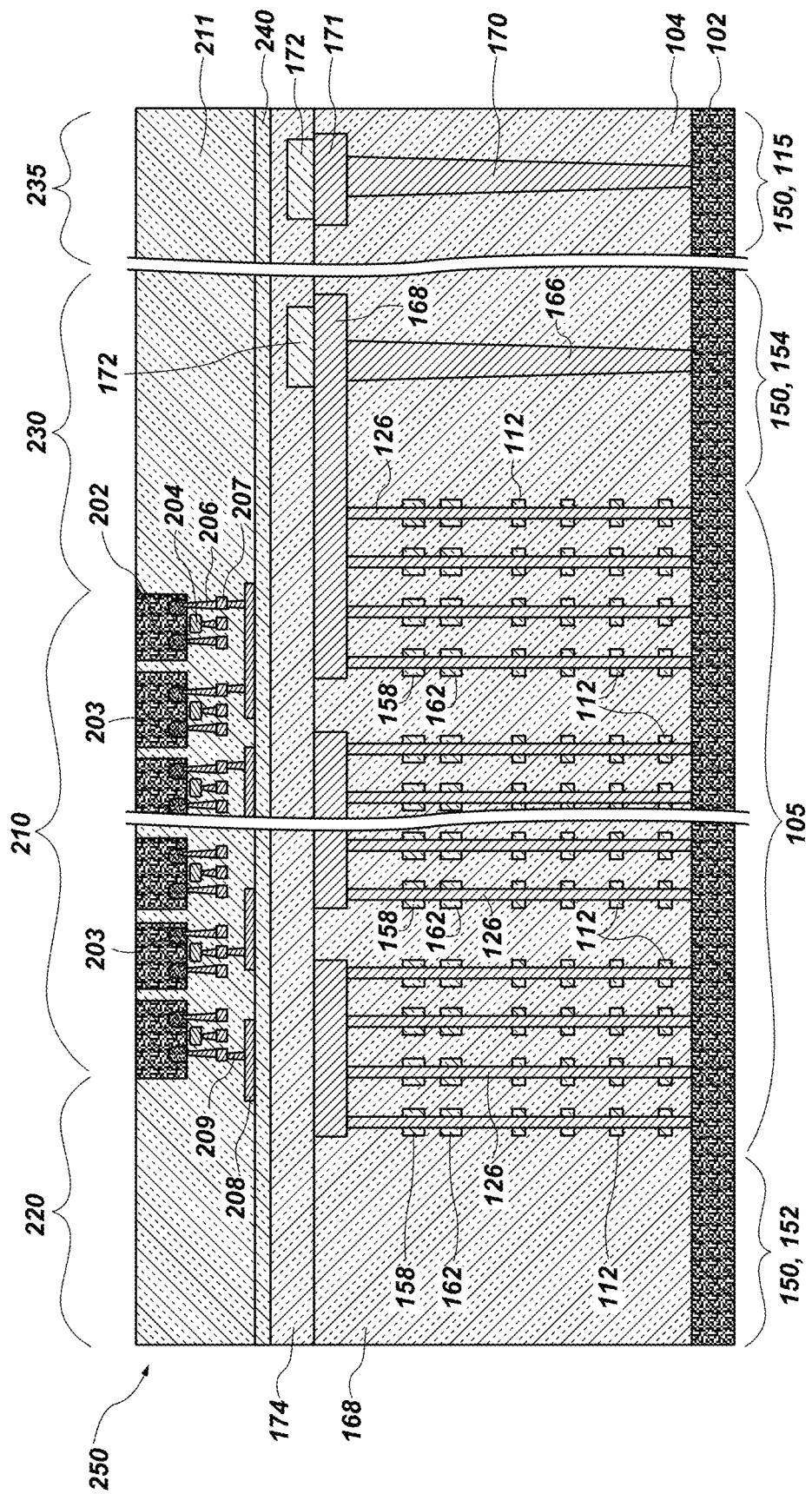
Figure 2E:
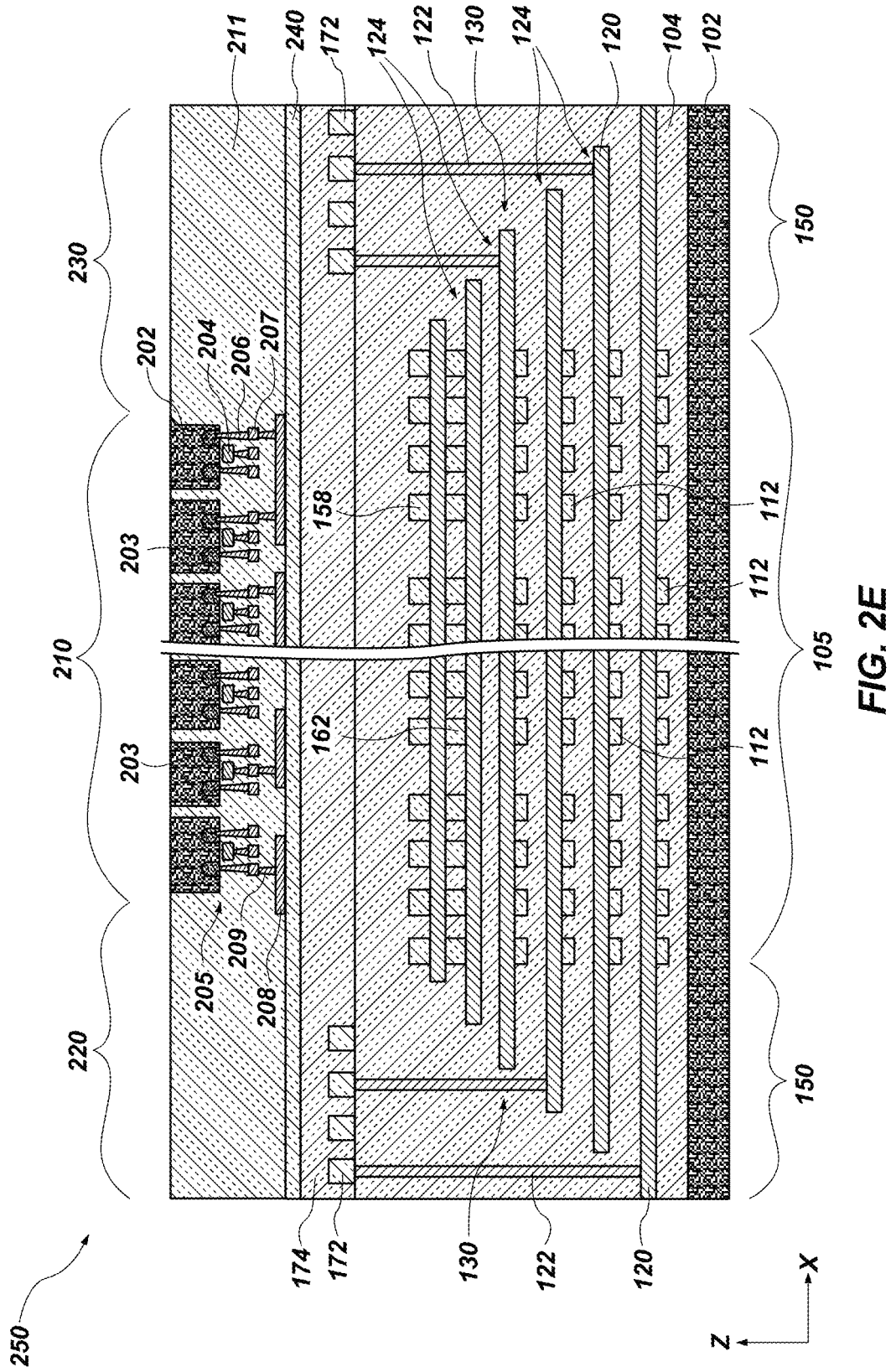

Referring now to FIG. 2D and FIG. 2E, the second microelectronic device structure 200 may be vertically (e.g., in the Z-direction) inverted (e.g., flipped) and attached to the first microelectronic device structure 100 to form a microelectronic device structure assembly 250 comprising the first microelectronic device structure 100 and the second microelectronic device structure 200. In some embodiments, the second microelectronic device structure 200 is flipped (e.g., vertically flipped), and the second oxide material 240 of the second microelectronic device structure 200 is bonded to the first oxide material 174 of the first microelectronic device structure 100 to attach the first microelectronic device structure 100 to the second microelectronic device structure 200.

For clarity and ease of understanding the description, the cross-section of FIG. 2D illustrates the same cross-sectional view illustrated in FIG. 2B (corresponding to section line B-B of FIG. 2A) and the cross-sectional view illustrated in FIG. 2C (corresponding to section line C-C of FIG. 2A). The cross-section of the first microelectronic device structure 100 of FIG. 2D corresponds to the cross-section taken through section line D-D of FIG. 1A and further includes the cross-section taken through section line G2-G2 of FIG. 1G. FIG. 2E illustrates the cross-sectional view of the second microelectronic device structure 200 taken through section line E-E of FIG. 2A and corresponding to locations vertically overlying the stack structure 125 (FIG. 1F). The cross-section of the first microelectronic device structure 100 of FIG. 2E corresponds to the cross-section of the first microelectronic device structure 100 illustrated in FIG. 1J.

In some embodiments, the first microelectronic device structure 100 is laterally (e.g., in the X-direction, in the Y-direction) aligned with the second microelectronic device structure 200 (e.g., such as within less than about 100 nanometers (nm)). For example, in some embodiments, the first conductive contact exit regions 152 of the first microelectronic device structure 100 are laterally aligned with the first conductive contact exit regions 220 of the second microelectronic device structure 200; the second conductive contact exit regions 154 of the first microelectronic device structure 100 are laterally aligned with the second conductive contact exit regions 230 of the second microelectronic device structure 200; the conductive pillar structures 126 and the global conductive structures 168 of the first microelectronic device structure 100 are laterally aligned with the sense amplifier regions 210 of the second microelectronic device structure 200; portions of the socket regions 115 of the first microelectronic device structure 100 are laterally aligned with the sub-word line driver regions 245 of the second microelectronic device structure 200; additional portions of the socket regions 115 of the first microelectronic device structure 100 are laterally aligned with the socket regions 235 of the second microelectronic device structure 200; and at least a portion of the array region 105 (e.g., the vertical stacks of memory cells 110) of the first microelectronic device structure 100 is laterally aligned with the one or more additional regions 215 of the second microelectronic device structure 200.

The first microelectronic device structure 100 is attached to the second microelectronic device structure 200 by contacting the first oxide material 174 of the first microelectronic device structure 100 with the second oxide material 240 of the second microelectronic device structure 200. After the first oxide material 174 and the second oxide material 240 are in contact, the first microelectronic device structure 100 and the second microelectronic device structure 200 may be exposed to annealing conditions to form bonds (e.g., oxide to oxide bonds) between the first oxide material 174 of the first microelectronic device structure 100 and the second oxide material 240 of the second microelectronic device structure 200 to form the microelectronic device structure assembly 250. In some embodiments, the first microelectronic device structure 100 and the second microelectronic device structure 200 are exposed to a temperature greater than, for example, 800° C., to form the oxide-to-oxide bonds and attach the first microelectronic device structure 100 to the second microelectronic device structure 200.

After attaching the first microelectronic device structure 100 to the second microelectronic device structure 200, the second base structure 202 may be thinned, such as by exposing the second base structure 202 to a CMP process. In some embodiments, thinning the second base structure 202 may expose the second oxide material 240 in regions outside the sense amplifier region 210, such as within the first conductive contact exit regions 220, the second conductive contact exit regions 230, the sub-word line driver regions 245, and the socket regions 235. In some embodiments, after thinning the second base structure 202, a vertical (e.g., in the Z-direction) thickness of the second base structure 202 may be within a range from about 300 nm to about 500 nm.

Figure 2F:
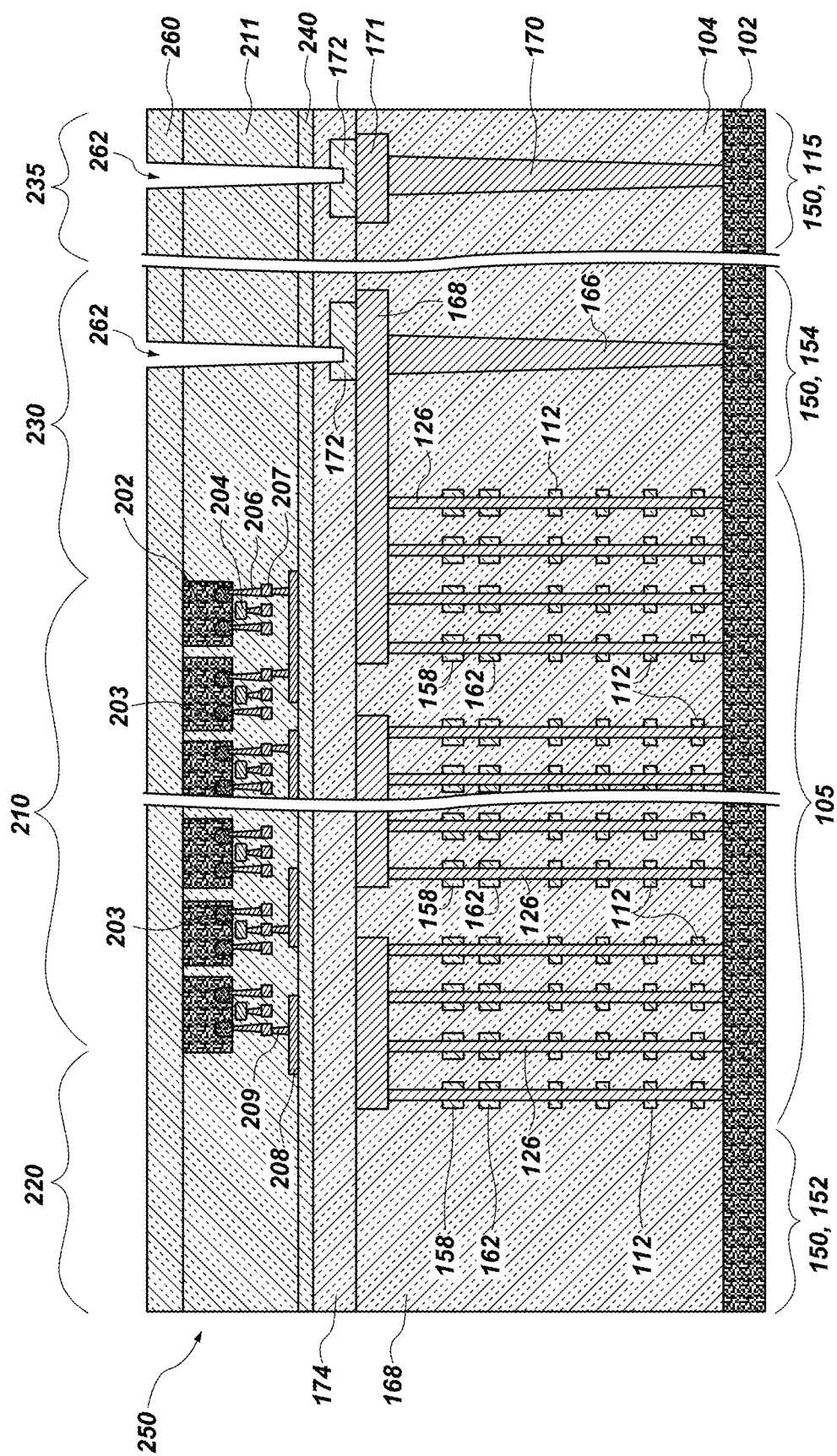
Figure 2G:
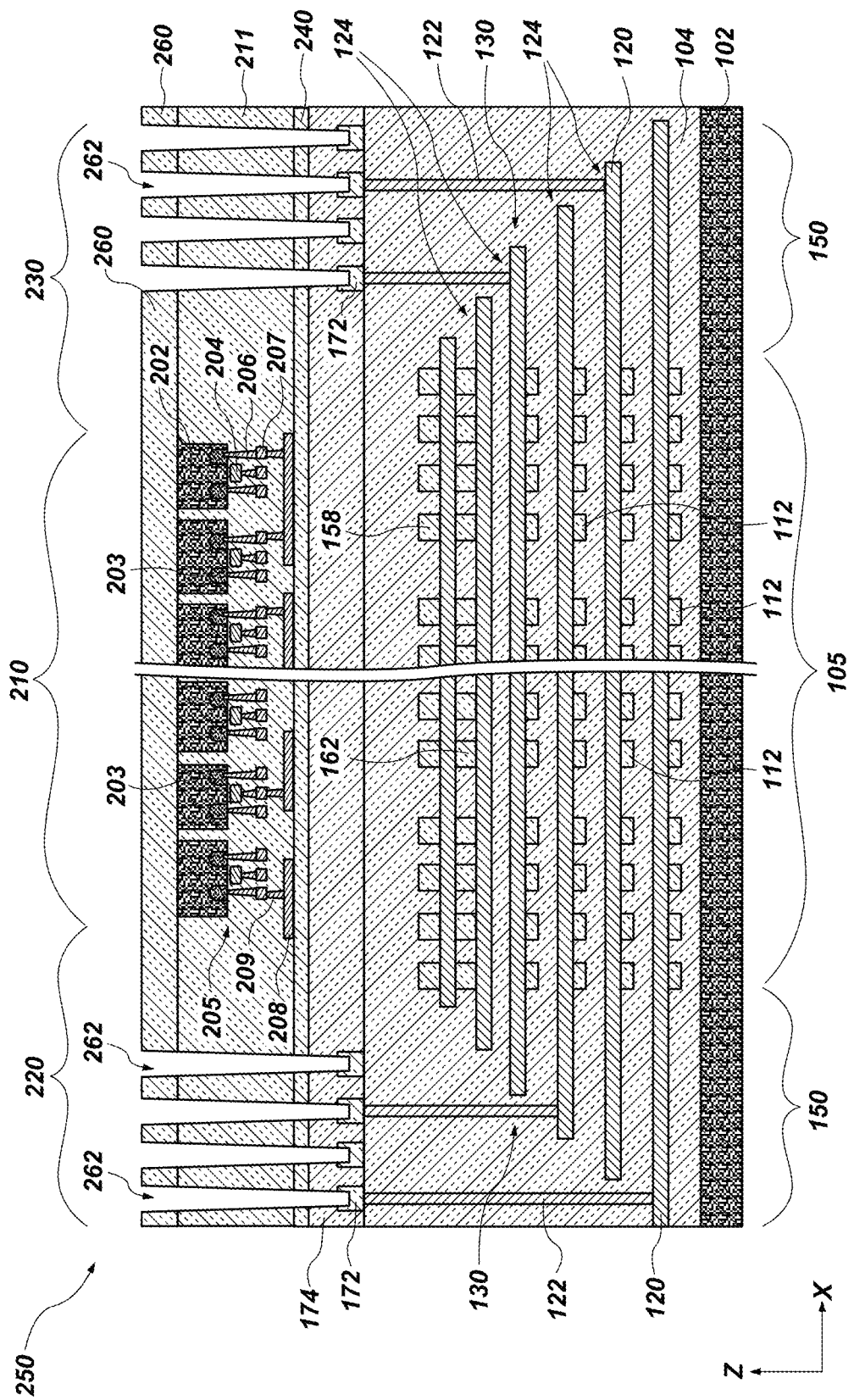

Referring now to FIG. 2F and FIG. 2G, which illustrate the same cross-sectional views of the microelectronic device 200 as FIG. 2D and FIG. 2E, respectively, after thinning the second base structure 202, a dielectric material 260 may be formed over the second microelectronic device structure 200. The dielectric material 260 may be formed of and include insulative material. In some embodiments, the dielectric material 260 comprises one or more of the materials described above with reference to the second oxide material 240. In some embodiments, the dielectric material 260 comprises silicon dioxide.

Openings 262 may be formed through the dielectric material 260 and the second oxide material 240 within, for example, the first conductive contact exit regions 220, the second conductive contact exit regions 230, and the socket regions 235. In some embodiments, the openings 262 expose the first sacrificial structures 172 within the first conductive contact exit regions 220, the second conductive contact exit regions 230, and the socket regions 235. In some embodiments, at least a portion of at least some of (e.g., each of) the first sacrificial structures 172 is removed.

Figure 2H:
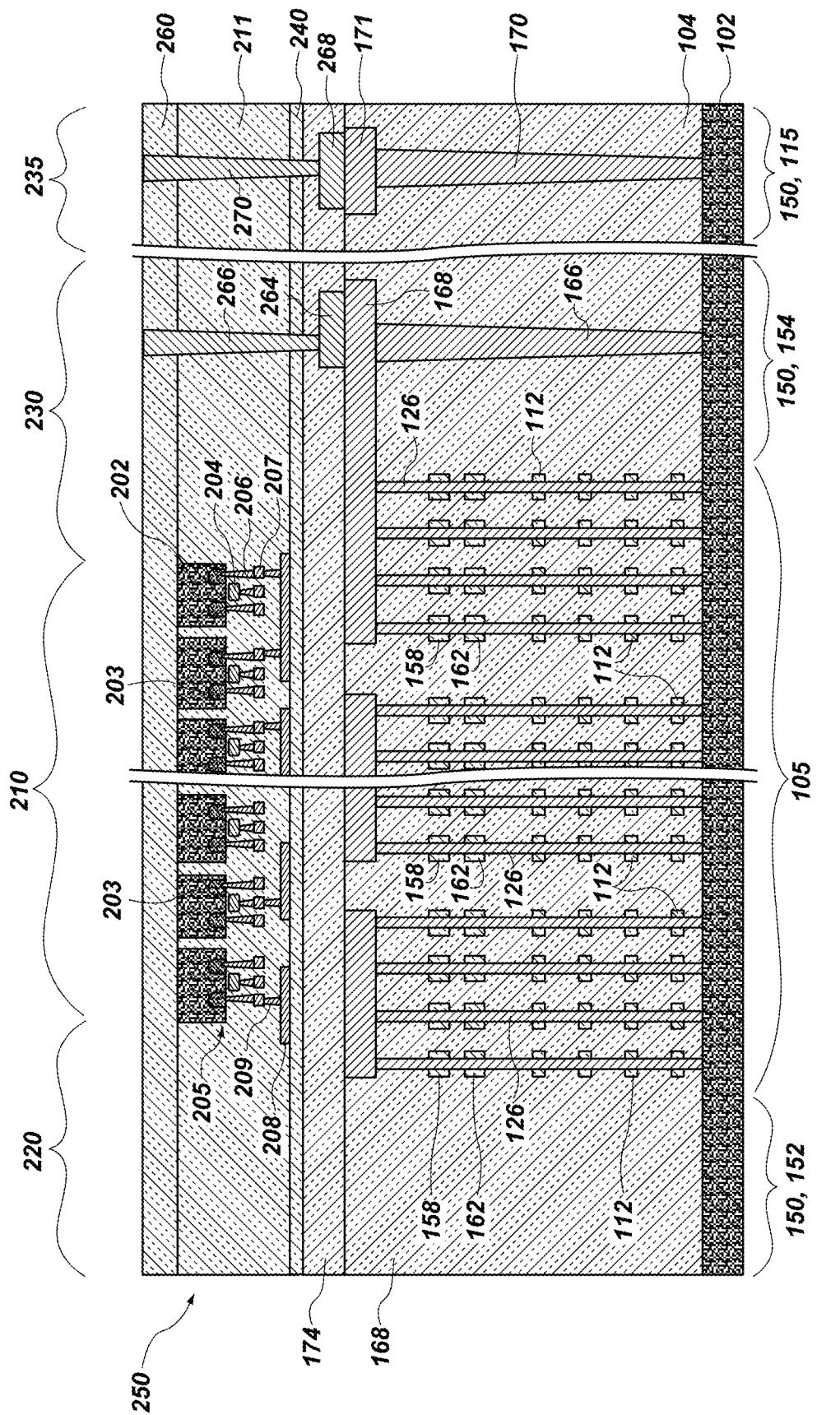
Figure 2I:
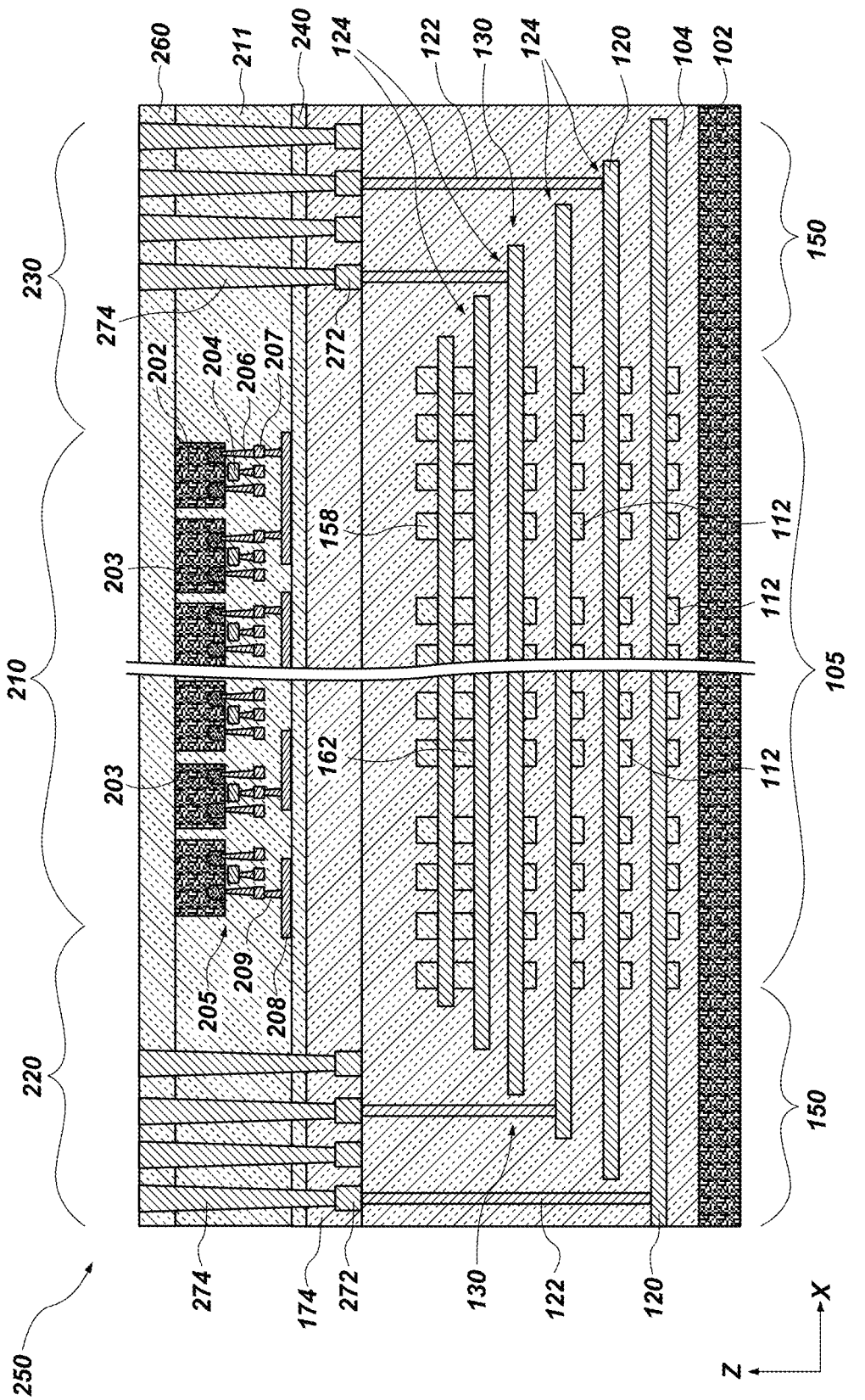

With collective reference to FIG. 2H and FIG. 2I, which illustrate the same cross-sectional views of the microelectronic device 200 as FIG. 2F and FIG. 2G, respectively, the first sacrificial structures 172 (FIG. 2F, FIG. 2G) may be selectively removed, such as by exposing the microelectronic device structure assembly 250 to one or more etch chemistries (e.g., chemical species, etchants) formulated to selectively remove the first sacrificial structures 172 without substantially removing the dielectric material 260, the second oxide material 240, the first oxide material 174, the global conductive structures 168, the first conductive pad structures 171, or the first conductive contact structures 122. By way of non-limiting example, in some embodiments, the first sacrificial structures 172 are selectively removed by exposing the first sacrificial structures 172 to a wet etch chemistry, such as phosphoric acid.

After selectively removing the first sacrificial structures 172, voids formed by removal of the first sacrificial structures 172 and the openings 262 (FIG. 2F, FIG. 2G) may be filled with conductive material to form second conductive pad structures 264 and second conductive interconnect structures 266 in the second conductive contact exit regions 230; third conductive pad structures 268 and third conductive interconnect structures 270 in the socket regions 235; and fourth conductive pad structures 272 and fourth conductive interconnect structures 274 in the first conductive contact exit regions 220.

The conductive material of the conductive pad structures 264, 268, 272 and the conductive interconnect structures 266, 270, 274 may comprise, for example, tungsten. In other embodiments, the conductive material of the conductive pad structures 264, 268, 272 and the conductive interconnect structures 266, 270, 274 comprises copper.

Figure 2J:
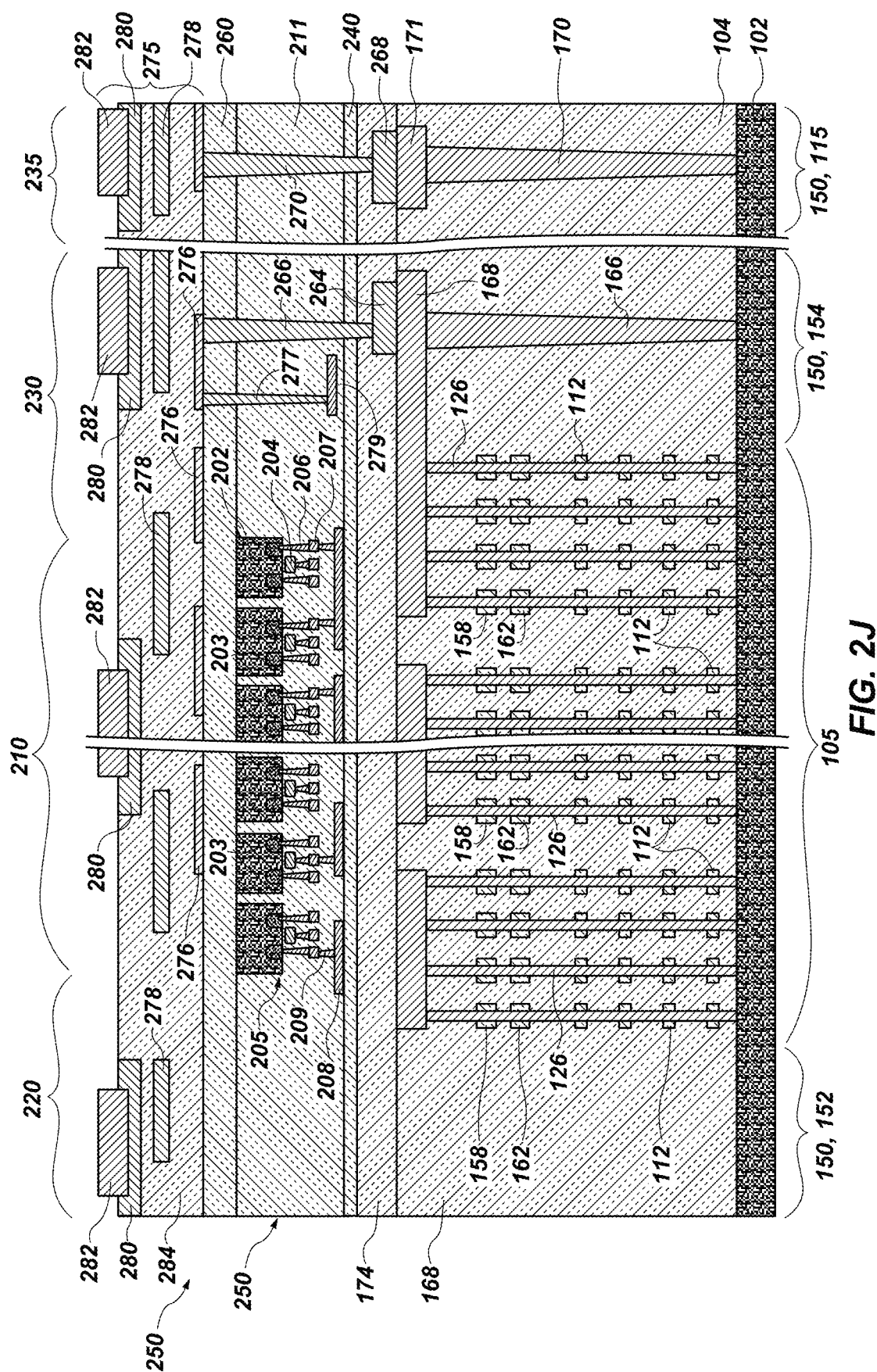
Figure 2K:
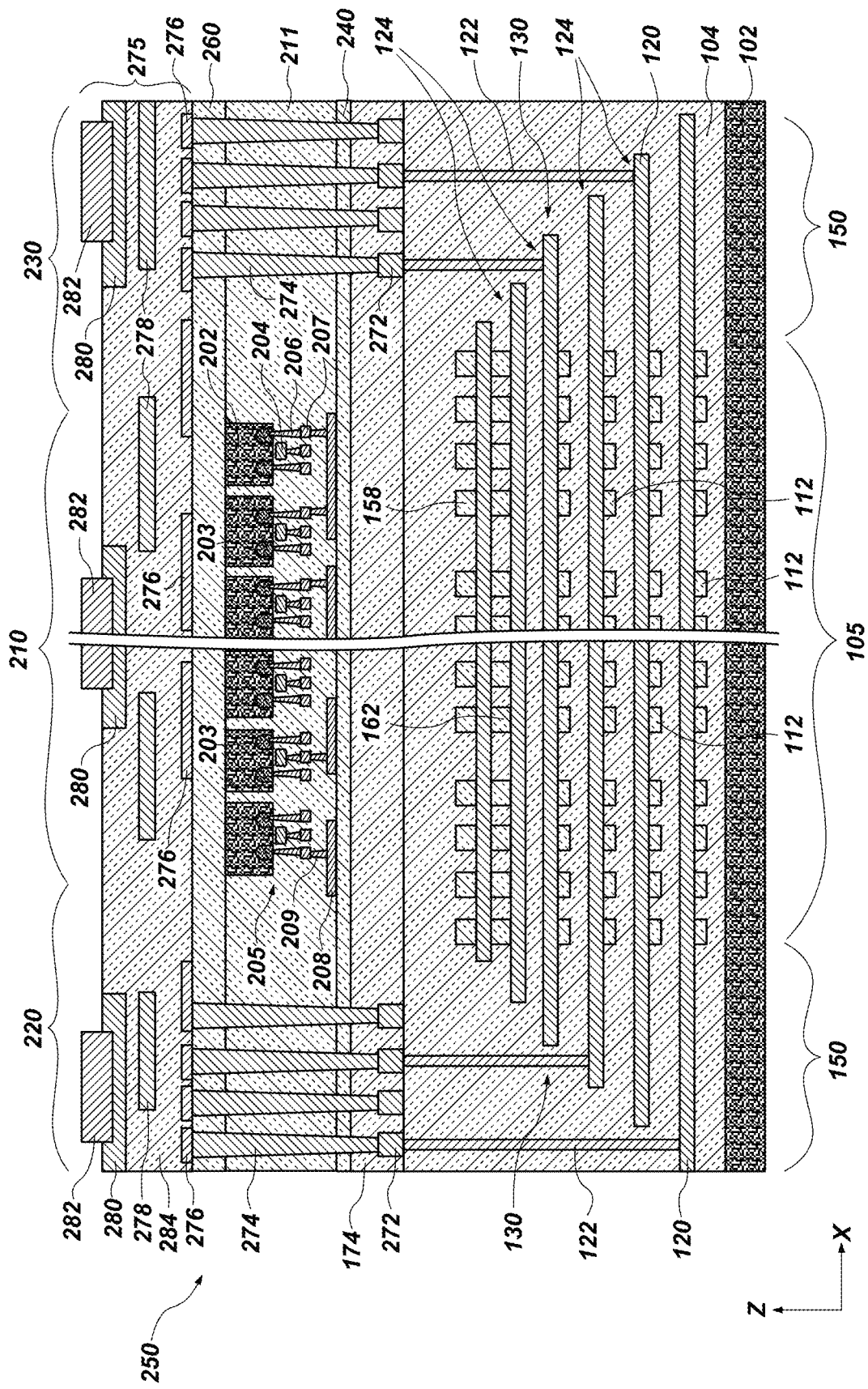

Referring to FIG. 2J and FIG. 2K, which illustrate the same cross-sectional views of the microelectronic device 200 as FIG. 2H and FIG. 2I, respectively, back end of the line (BEOL) structures may be formed over the microelectronic device structure assembly 250 in a back end of line region 275. The back end of the line region 275 may include, for example, fifth conductive pad structures 276, one or more conductive line structures 278, one or more sixth conductive pad structures 280, and one or more conductive landing pad structures 282. Each of the fifth conductive pad structures 276, conductive line structures 278, and sixth conductive pad structures 280 may be located within an insulative material 284, such as, for example, silicon dioxide.

At least some of the fifth conductive pad structures 276 may overlie and be in contact with, for example, the fourth conductive interconnect structures 274 that are, in turn, in electrical communication with the first conductive contact structures 122. At least additional fifth conductive pad structures 276 vertically (e.g., in the Z-direction) overlie the transistor structures 205. With reference to FIG. 2J, at least one of the fifth conductive pad structures 276 may be in electrical communication with an interconnect structure 277 that is, in turn, in electrical communication with a conductive routing structure 279.

Each of the fifth conductive pad structures 276, the conductive line structures 278, and the sixth conductive pad structures 280 may individually be formed of and include conductive material. In some embodiments, the fifth conductive pad structures 276, the conductive line structures 278, the sixth conductive pad structures 280 individually comprise copper. In other embodiments, each of the fifth conductive pad structures 276, the conductive line structures 278, the sixth conductive pad structures 280 comprise copper.

The interconnect structure 277 and the conductive routing structure 279 may be formed of and include conductive material. In some embodiments, the interconnect structure 277 and the conductive routing structure 279 comprise copper. In other embodiments, the interconnect structure 277 and the conductive routing structure 279 comprise tungsten.

The conductive landing pad structures 282 may be formed of and include conductive material. In some embodiments, the conductive landing pad structures 282 comprise aluminum. In other embodiments, the conductive landing pad structures 282 comprise copper. In yet other embodiments, the conductive landing pad structures 282 comprise tungsten.

In some embodiments, the first conductive contact structures 122 may be electrically coupled to the second microelectronic device structure 200 (e.g., directly to the back end of the line region 275) directly vertically (e.g., in the Z-direction) above the first conductive contact structures 122 (e.g., without rerouting the first conductive contact structures 122). In some embodiments, each of the first conductive contact structures 122 are in electrical communication with the sub-word line driver regions 245 (FIG. 2A) of the second microelectronic device structure 200, which may be located on the second microelectronic device structure 200 directly above the first conductive contact structures 122. For example, one or more of the fourth conductive pad structures 272, the fourth conductive interconnect structures 274, and the fifth conductive pad structures 276 in electrical communication with the first conductive contact structures 122 may be in electrical communication with circuitry of the sub-word line driver region.

In some embodiments, one or more of the third conductive pad structures 268, the second conductive interconnect structures 266, and the fifth conductive pad structures 276 may be in electrical communication with circuitry of the sense amplifier region 210.

Forming the microelectronic device structure assembly 250 by attaching the first microelectronic device structure 100 to the second microelectronic device structure 200 facilitates independently forming structures and circuitry of each of the first microelectronic device structure 100 and the second microelectronic device structure 200. For example, high performance logic devices and CMOS circuitry of the second microelectronic device structure 200 may be fabricated at lower temperatures than logic devices and circuitry of the first microelectronic device structure 100. After forming the circuitry of the second microelectronic device structure 200, the second microelectronic device structure 200 may be attached to the first microelectronic device structure 100.

The first microelectronic device structure 100 may be attached to the second microelectronic device structure 200 to form the microelectronic device structure assembly 250 without forming copper to copper bonding. Rather, the first microelectronic device structure 100 is attached and bonded to the second microelectronic device structure 200 by (e.g., only by) oxide to oxide bonding (e.g., of the first oxide material 174 of the first microelectronic device structure 100 to the second oxide material 240 of the second microelectronic device structure 200) and without copper-to-copper bonding.

Forming the first microelectronic device structure 100 to include the first sacrificial structures 172 may facilitate formation of electrical connections and routing between the first microelectronic device structure 100 and the second microelectronic device structure 200. For example, the first sacrificial structures 172 may be formed and patterned during fabrication of the first microelectronic device structure 100. In some embodiments, since the first sacrificial structures 172 are formed in contact with each of the first conductive contact structures 122, the global conductive structures 168, and the first conductive pad structures 171, replacement of the first sacrificial structures 172 with conductive material may form electrical connections between the components of the first microelectronic device structure 100 to the components of the second microelectronic device structure 200. Accordingly, after attachment of the second microelectronic device structure 200 to the first microelectronic device structure 100 and selective removal and replacement of the first sacrificial structures 172 with conductive material, electrical connections may be made through the second microelectronic device structure 200 to each of the conductive structures 120 (e.g., through the first conductive contact structures 122), the conductive pillar structures 126 (e.g., through the electrical connection to the global conductive structures 168), and to the socket regions 115 (e.g., through the first conductive pad structures 171). In some such embodiments, conductive routing of components and circuitry of the first microelectronic device structure 100 may be coupled to conductive structures and circuitry of the second microelectronic device structure 200 simultaneously.

In addition, since the sub-word line driver regions 245 are located directly vertically above the conductive structures 120 and the first conductive contact exit regions 152, the sub-word line drivers may be operably coupled to the vertical stacks of memory cells 110 in the array region 105 with relatively shorter electrical connections. Further, at least some of the electrical connections between the sub-word line drivers and the vertical stacks of memory cells 110 (e.g., the fourth conductive pad structures 272, the fourth conductive interconnect structure 274, the fifth conductive pad structures 276) may be formed of a low RC material, such as copper. Accordingly, data transmission between the memory cells 110 and the sub-word line drivers may be relatively faster compared to conventional microelectronic devices. Similarly, since the sense amplifier regions 210 are directly vertically above the global conductive structures 168 and the conductive pillar structures 126, the sense amplifiers may be operably coupled to the vertical stacks of memory cells 110 in the array region 105 with relatively shorter electrical connections. At least some of the electrical connections between the sense amplifiers and the vertical stacks of memory cells 110 (e.g., the second conductive pad structures 264, the second conductive interconnect structures, the fifth conductive pad structures 276) may be formed of a low RC material, such as copper. Accordingly, data transmission between the memory cells 110 and the sense amplifiers may be relatively faster compared to conventional microelectronic devices.

Although FIG. 2A through FIG. 2K have been described and illustrated as forming a microelectronic device (e.g., a memory device) by replacement of first sacrificial structures 172 from only the first microelectronic device structure 100, the disclosure is not so limited. FIG. 3A through FIG. 3K illustrate an additional method of forming a microelectronic device, in accordance with embodiments of the disclosure.

Figure 3A:
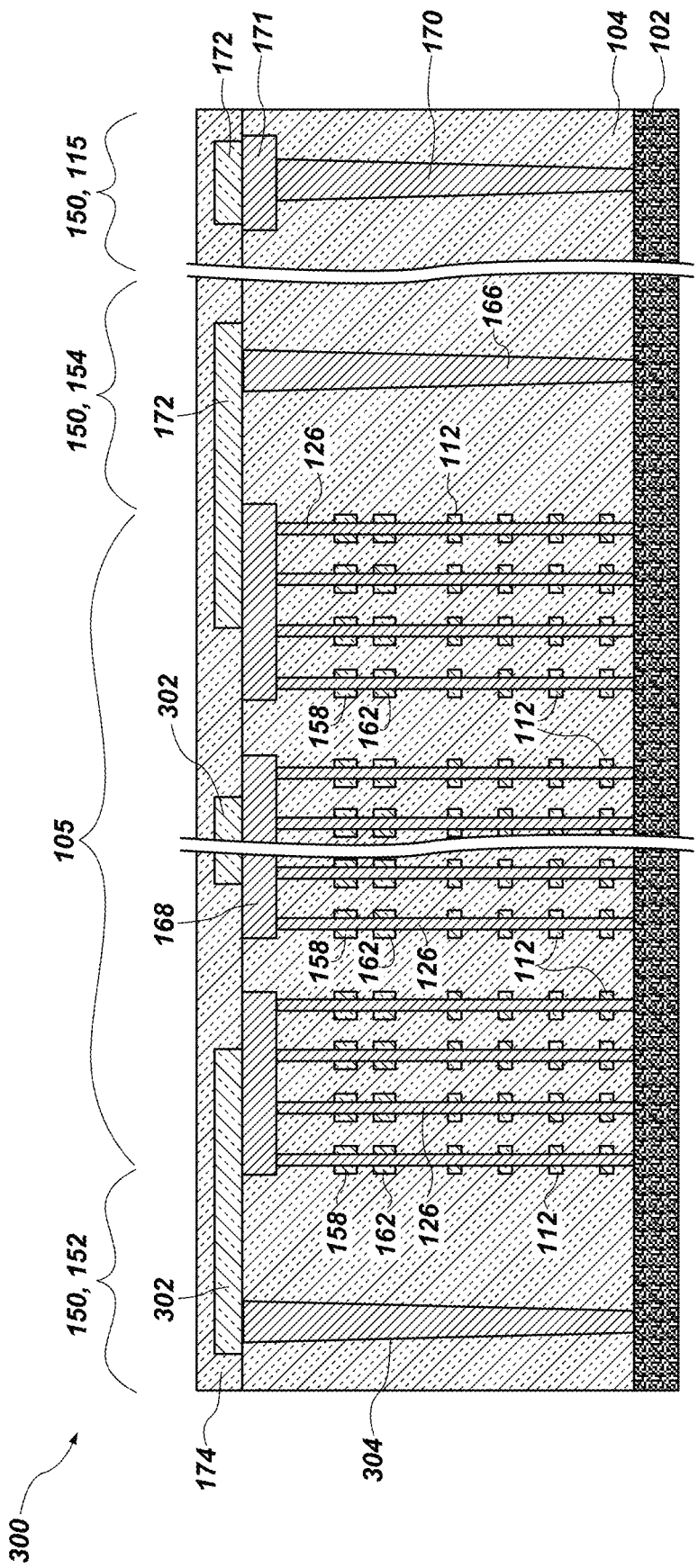
FIG. 3A through FIG. 3K include simplified partial cross-sectional views illustrating a method of forming a microelectronic device, in accordance with other embodiments of the disclosure.

FIG. 3A is a simplified partial cross-sectional view of a first microelectronic device structure 300, in accordance with embodiments of the disclosure. The first microelectronic device structure 300 may be substantially the same as the first microelectronic device structure 100 illustrated in FIG. 2D, except the first microelectronic device structure 300 may include second sacrificial structures 302 directly vertically (e.g., in the Z-direction) over and in contact with the global conductive structures 168 and may include fifth conductive interconnect structures 304 vertically (e.g., in the Z-direction) extending through the insulative structure 104. The fifth conductive interconnect structures 304 may be located in, for example, the first conductive contact exit region 152.

In some embodiments, at least some of the second sacrificial structures 302 are in contact with the fifth conductive interconnect structures 304. The fifth conductive interconnect structures 304 may be in contact with a second sacrificial structures 302 and with the first base structure 102. The second sacrificial structure 302 and the fifth conductive interconnect structures 304 may be formed of and include the same materials described above with reference to the first sacrificial structures 172 and the first conductive interconnect structures 166, respectively.

Figure 3B:
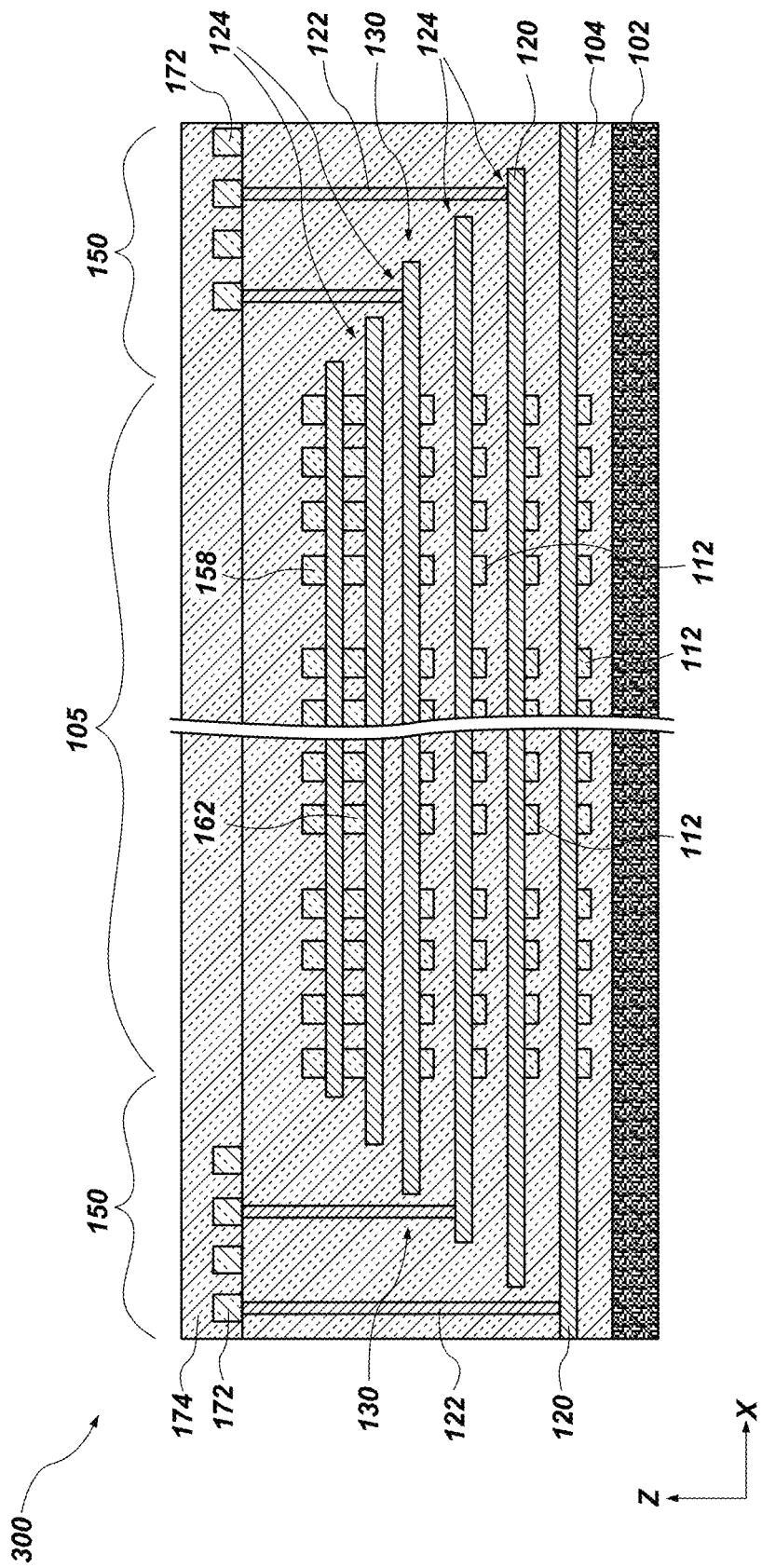

FIG. 3B is a simplified partial cross-sectional view of the first microelectronic device structure 300 taken through the same cross-section of FIG. 1J. The cross-section of the first microelectronic device structure 300 illustrated in FIG. 3B may be substantially similar to the cross-section of the first microelectronic device structure 100 illustrated in FIG. 2E.

Figure 3C:
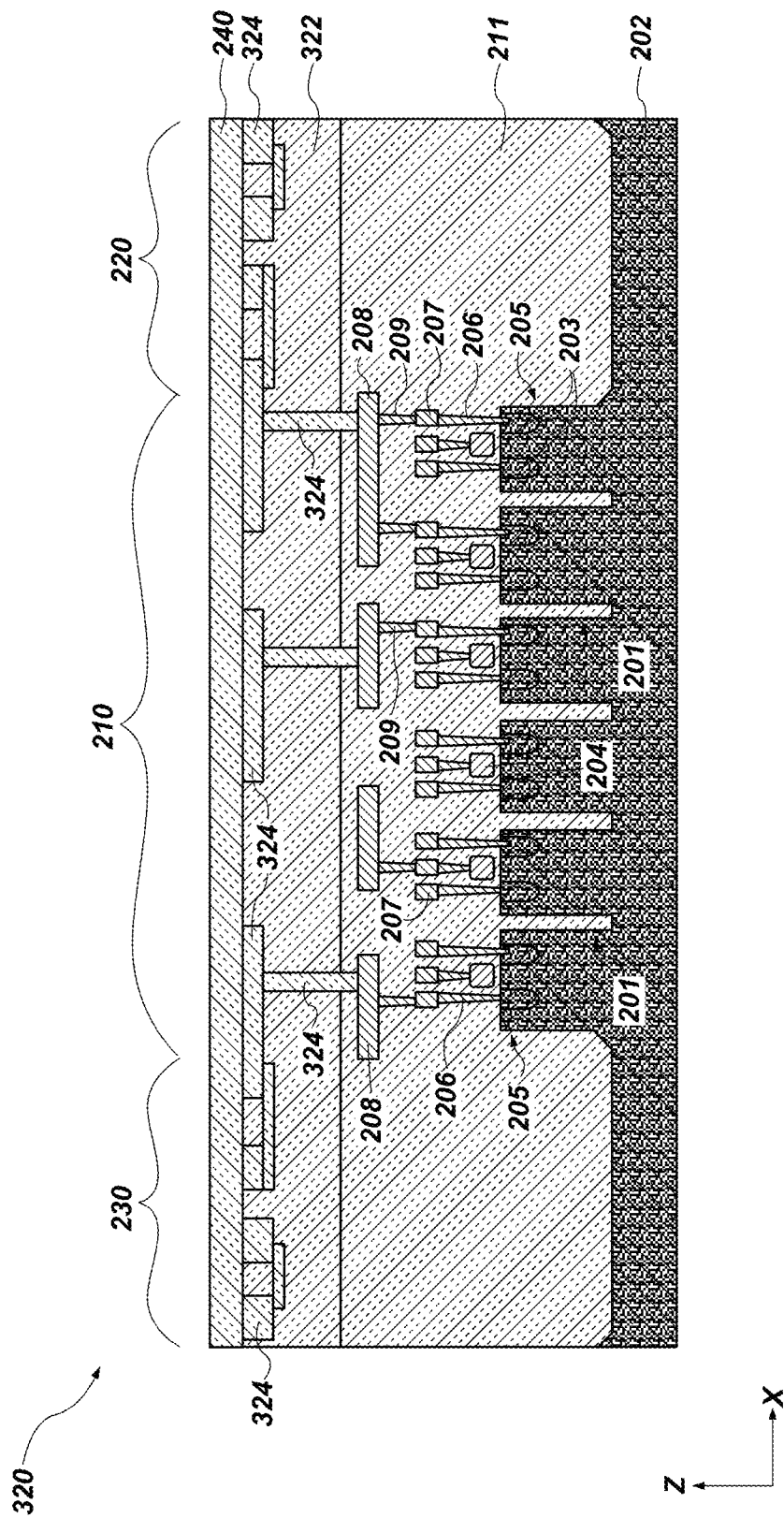

With reference to FIG. 3C, a second microelectronic device structure 320 may be substantially the same as the second microelectronic device structure 200 described above with reference to FIG. 2A through FIG. 2C, except the second microelectronic device structure 320 may include a third oxide material 322 vertically (e.g., in the Z-direction) overlying the insulative material 211 and third sacrificial structures 324 within the third oxide material 322. In some embodiments, the third oxide material 322 is vertically between the insulative material 211 and the second oxide material 240, which may vertically overlie the third oxide material 322 and the third sacrificial structures 324. The third oxide material 322 may comprise one or more of the materials described above with reference to the second oxide material 240 (FIG. 2B). In some embodiments, the third oxide material 322 comprises silicon dioxide.

The third sacrificial structures 324 may be in contact with the pad structures 208 of the second microelectronic device structure 320. In some embodiments, portions of the third sacrificial structures 324 may laterally (e.g., in the X-direction, in the Y-direction) extend to regions of the second microelectronic device structure 320 external to the sense amplifier region 210. In some embodiments, at least some of the third sacrificial structures 324 may be located within the first conductive contact exit region 220 and the second conductive contact exit region 230. Third sacrificial structures 324 may also be located within the socket regions 235 (FIG. 2A), the sub-word line driver regions 245 (FIG. 2A), and the one or more additional regions 215 (FIG. 2A). Although FIG. 3C illustrates the transistor structures 205 within the sense amplifier region 210, it will be understood that other regions of the second microelectronic device structure 320 may include the transistor structures 205. For example, one or more of (e.g., each of) the socket regions 235, the sub-word line driver regions 245, and the one or more additional regions 215 may include the transistor structures 205.

Figure 3D:
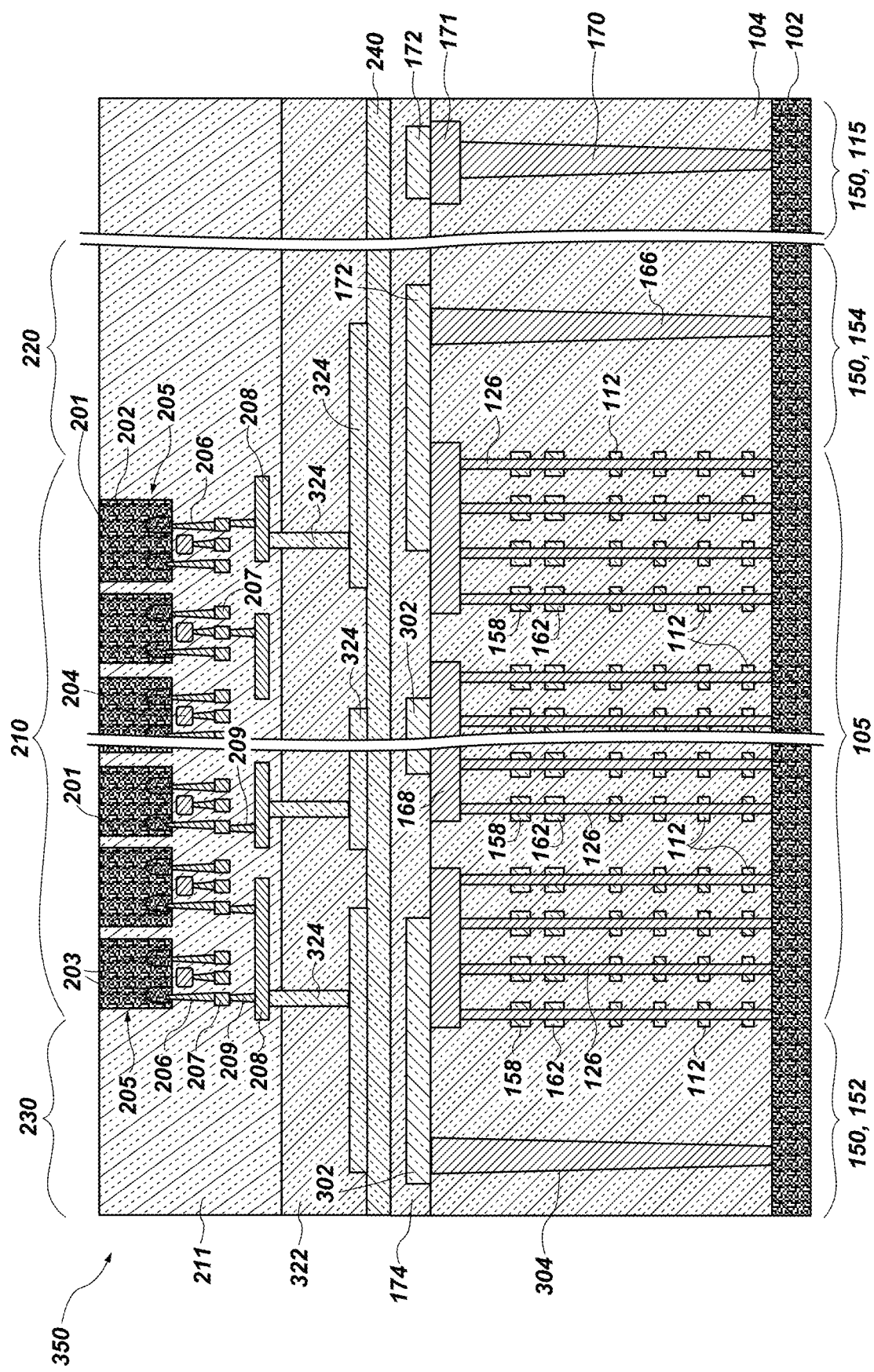
Figure 3E:
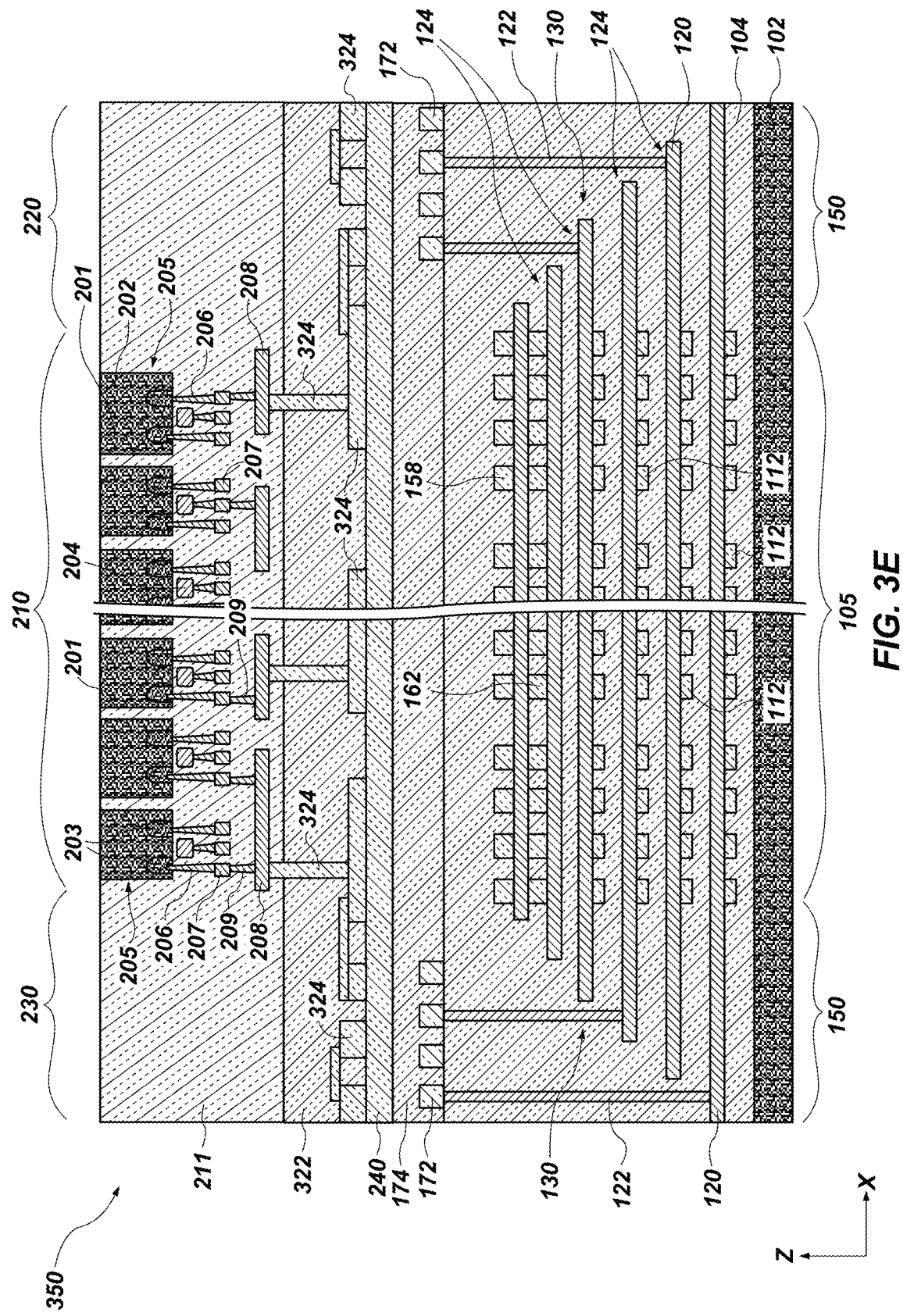

With reference now to FIG. 3D and FIG. 3E, which illustrate the same cross-sectional view of the first microelectronic device structure 300 as FIG. 3A and FIG. 3B, respectively, the second microelectronic device structure 320 may be vertically (e.g., in the Z-direction) flipped and bonded to the first microelectronic device structure 300 to form a microelectronic device structure assembly 350, as described above with reference to FIG. 2D and bonding of the first microelectronic device structure 100 to the second microelectronic device structure 200. In some embodiments, the second oxide material 240 of the second microelectronic device structure 320 is bonded to the first oxide material 174 of the first microelectronic device structure 300.

After bonding the second microelectronic device structure 320 to the first microelectronic device structure 300, the second base structure 202 of the second microelectronic device structure 320 may be thinned, such as by exposing the second base structure 202 to a CMP process, as described above with reference to FIG. 2D.

Figure 3F:
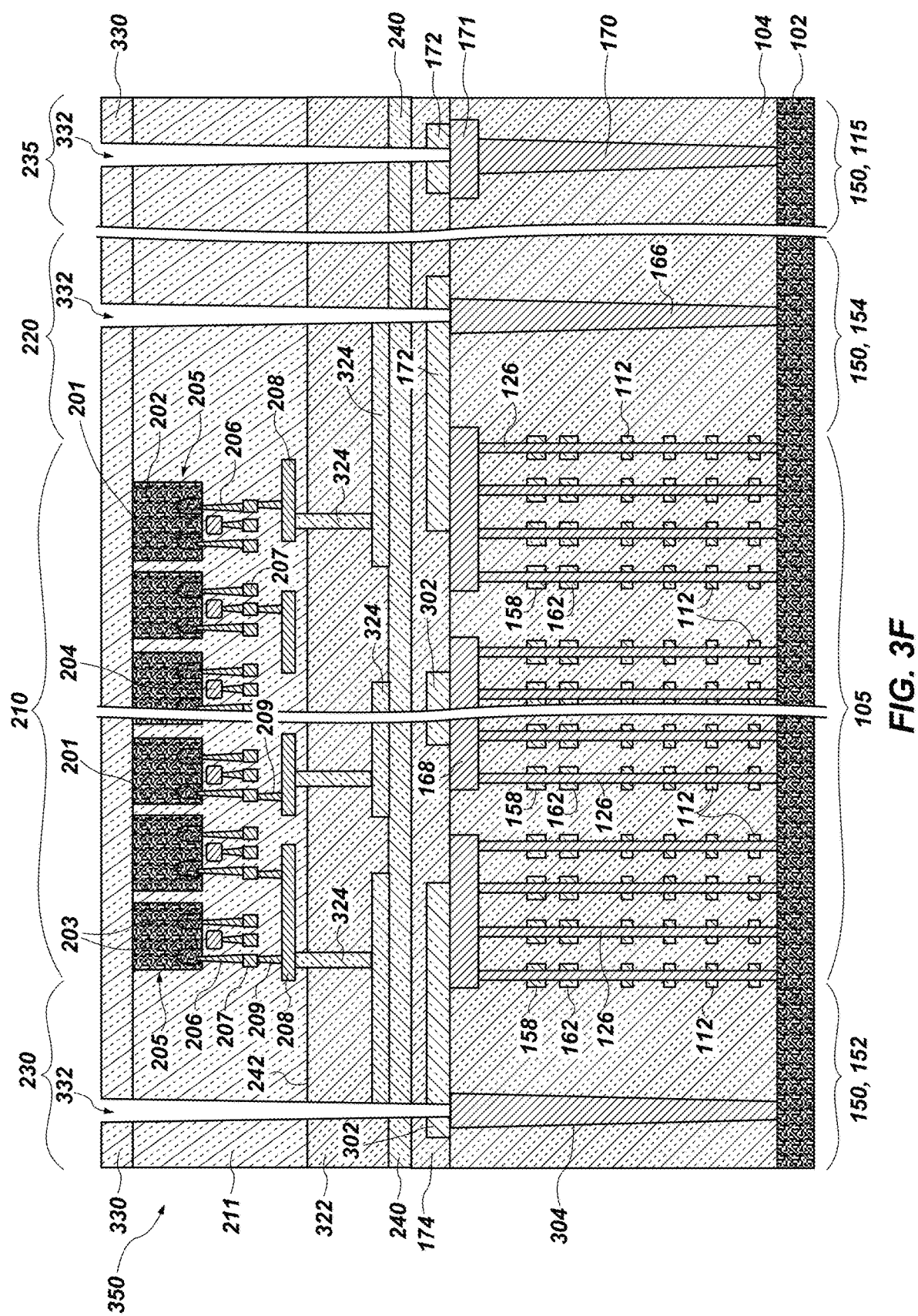
Figure 3G:
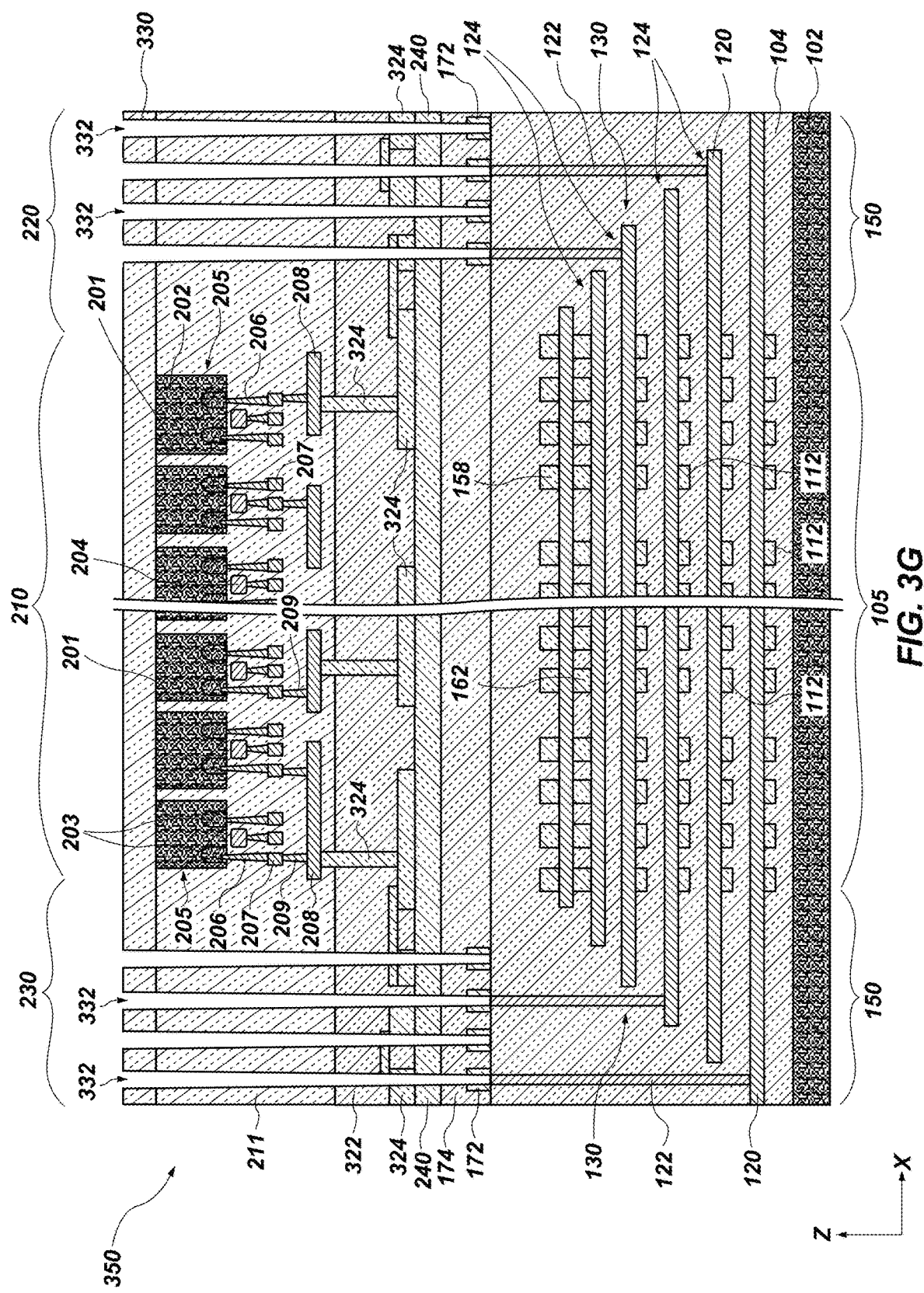

Referring collectively to FIG. 3F and FIG. 3G, which are simplified partial cross-sectional views of the microelectronic device structure assembly 350 illustrating the same cross-sections as FIG. 3D and FIG. 3E, respectively, after removing portions of the second base structure 202, a second dielectric material 330 may be formed over the microelectronic device structure assembly 350 and openings 332 may be formed through the second dielectric material 330, the second oxide material 240, the third oxide material 322, and the second oxide material 240 to expose at least some of the third sacrificial structures 324, the second sacrificial structures 302, the first sacrificial structures 172, and at least some of the first conductive contact structures 122, the first conductive interconnect structures 166, the first conductive pad structures 171, and the fifth conductive interconnect structures 304. In some embodiments, at least some of the conductive material of the first conductive contact structures 122, the first conductive interconnect structures 166, the first conductive pad structures 171, and the fifth conductive interconnect structures 304 may be removed during formation of the openings 332.

The second dielectric material 330 may comprise one or more of the materials described above with reference to the second oxide material 240. In some embodiments, the second dielectric material 330 comprises substantially the same material composition as the second oxide material 240. In some embodiments, the second dielectric material 330 comprises silicon dioxide.

Figure 3H:
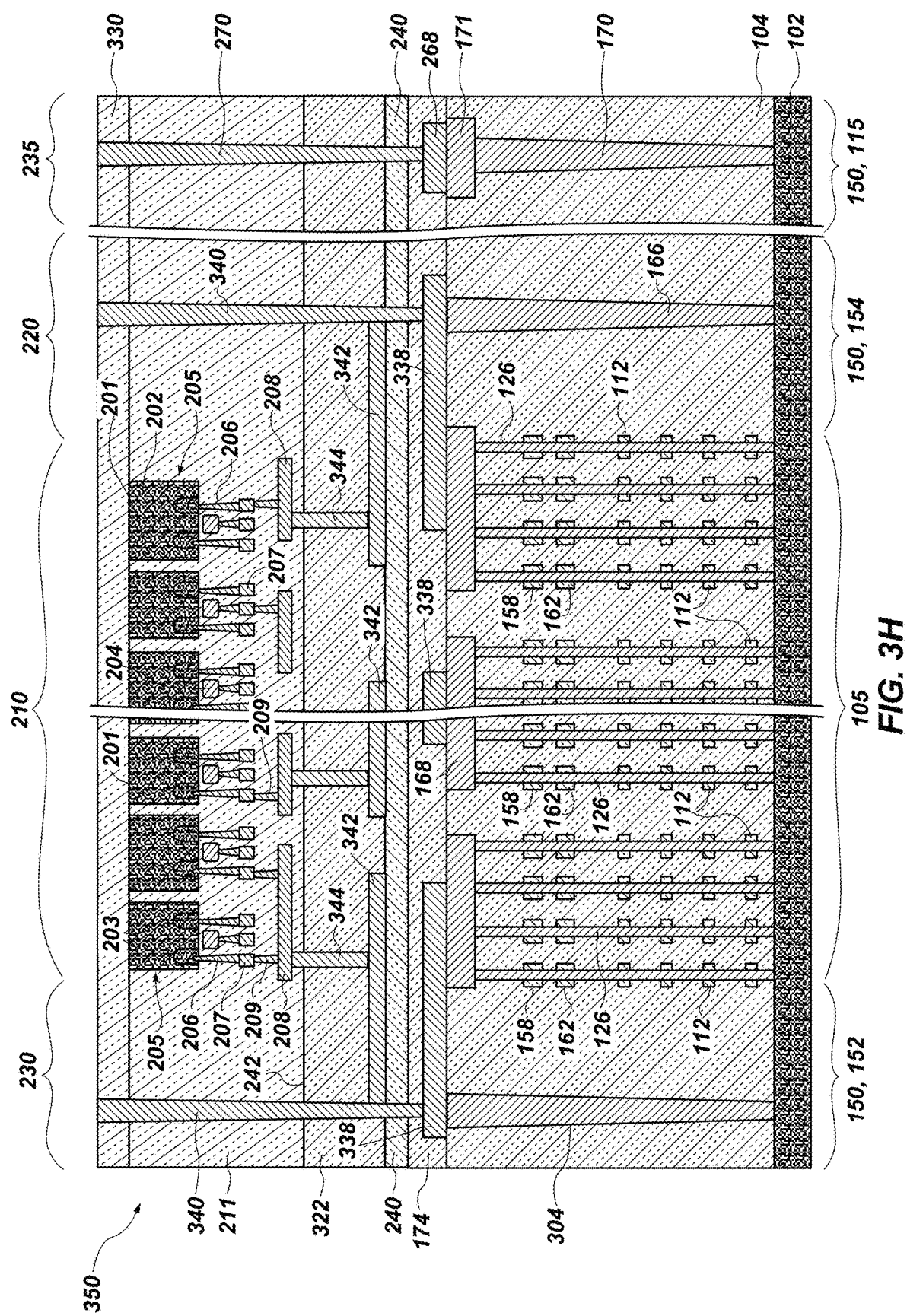
Figure 3I:
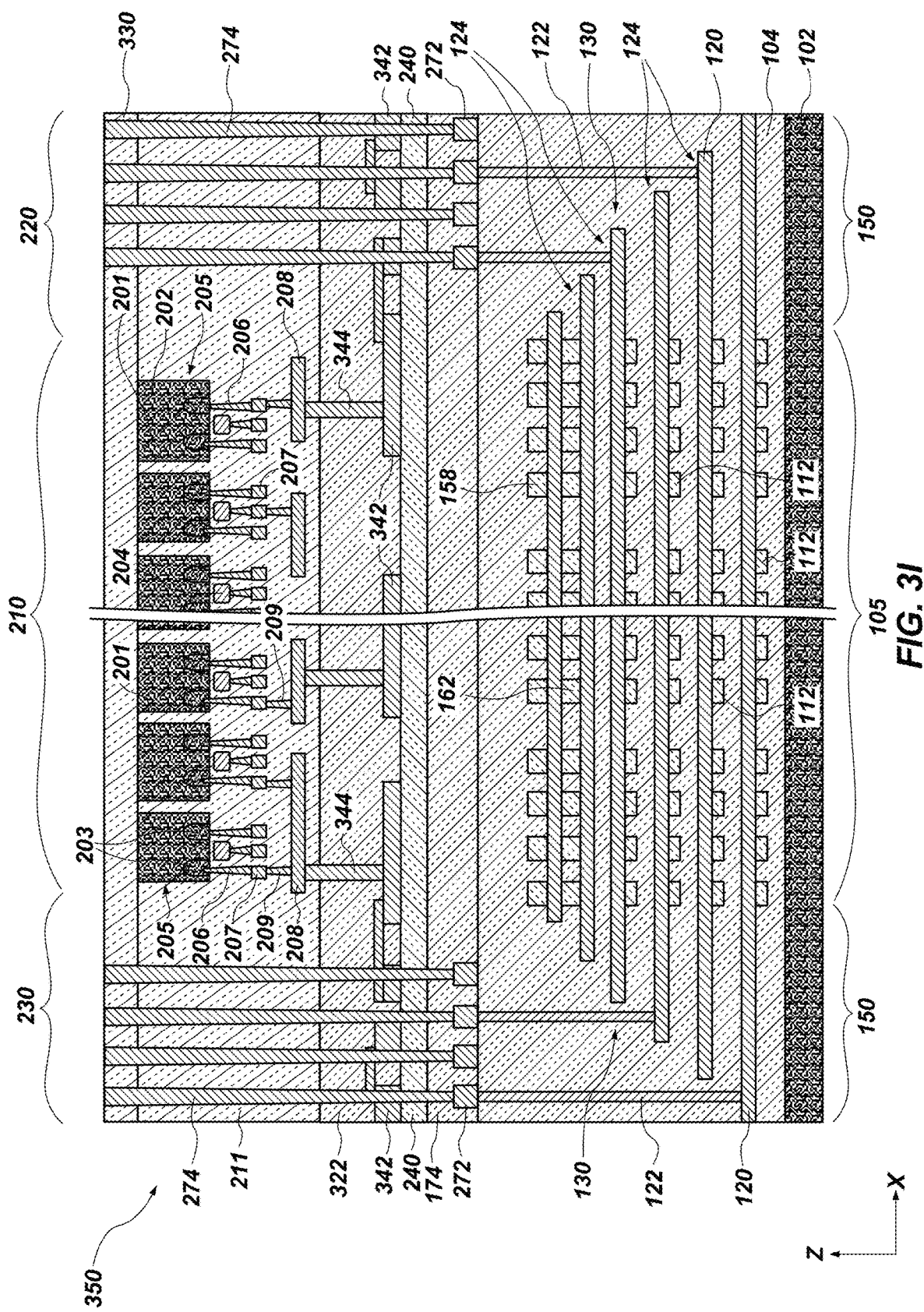

With reference to FIG. 3H and FIG. 3I, which are simplified partial cross-sectional view of the microelectronic device structure assembly 350 illustrating the same cross-sectional views as FIG. 3F and FIG. 3G, respectively, the first sacrificial structures 172, the second sacrificial structures 302, and third sacrificial structures 324 may be selectively removed and replaced with conductive material to form conductive structures, such as, for example, the third conductive pad structures 268 in electrical communication with the first conductive pad structures 171, and the third conductive interconnect structures 270 in electrical communication with third conductive pad structures 268.

Seventh conductive pad structures 338 may be formed in electrical communication with the global conductive structures 168, the first conductive interconnect structures 166, and the fifth conductive interconnect structures 304. At least some of the seventh conductive pad structures 338 may be in electrical communication with sixth conductive interconnect structures 340 vertically extending through the second microelectronic device structure 320 and electrically coupling the first conductive interconnect structures 166 and the fifth conductive interconnect structures 304 of the first microelectronic device structure 300 to an upper surface of the second microelectronic device structure 320.

In addition, replacement of the third sacrificial structures 324 may form conductive routing structures 342 laterally (e.g., in the X-direction, in the Y-direction) extending through the third oxide material 322. In some embodiments, the conductive routing structures 342 facilitate electrical communication of at least some of the sixth conductive interconnect structures 340 to the pad structures 208 of the second microelectronic device structure 320 through seventh conductive interconnect structures 344.

With reference to FIG. 3I, replacement of the first sacrificial structures 172 in communication with the first conductive contact structures 122 may form the fourth conductive pad structures 272 in electrical communication with the first conductive contact structures 122. Filling the openings 332 (FIG. 3G) with the conductive material may form the fourth conductive interconnect structures 274 in electrical communication with the first conductive contact structures 122 through the fourth conductive pad structures 272.

Each of the third conductive pad structures 268, the third conductive interconnect structure 270, the fourth conductive pad structures 272, the fourth conductive interconnect structures 274, the seventh conductive pad structures 338, the sixth conductive interconnect structures 340, the conductive routing structures 342, and the seventh conductive interconnect structures 344 may be formed of and include conductive material. In some embodiments, the third conductive pad structures 268, the third conductive interconnect structure 270, the fourth conductive pad structures 272, the fourth conductive interconnect structures 274, the seventh conductive pad structures 338, the sixth conductive interconnect structures 340, the conductive routing structures 342, and the seventh conductive interconnect structures 344 comprise substantially the same material composition since the structures are formed substantially simultaneously. In some embodiments, the third conductive pad structures 268, the third conductive interconnect structure 270, the fourth conductive pad structures 272, the fourth conductive interconnect structures 274, the seventh conductive pad structures 338, the sixth conductive interconnect structures 340, the conductive routing structures 342, and the seventh conductive interconnect structures 344 comprise copper. In other embodiments, the third conductive pad structures 268, the third conductive interconnect structure 270, the fourth conductive pad structures 272, the fourth conductive interconnect structures 274, the seventh conductive pad structures 338, the sixth conductive interconnect structures 340, the conductive routing structures 342, and the seventh conductive interconnect structures 344 comprise tungsten.

Figure 3J:
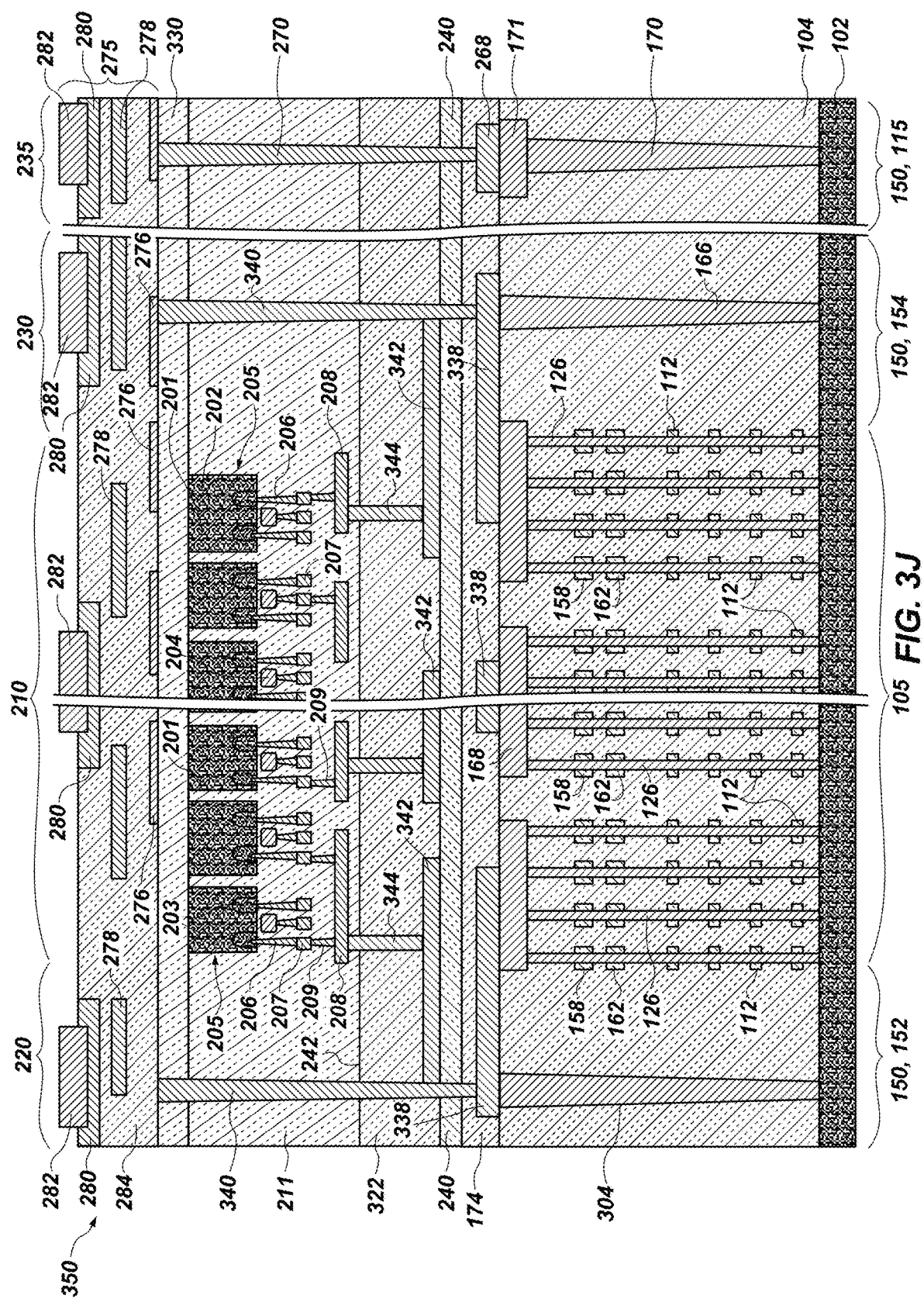
Figure 3K:
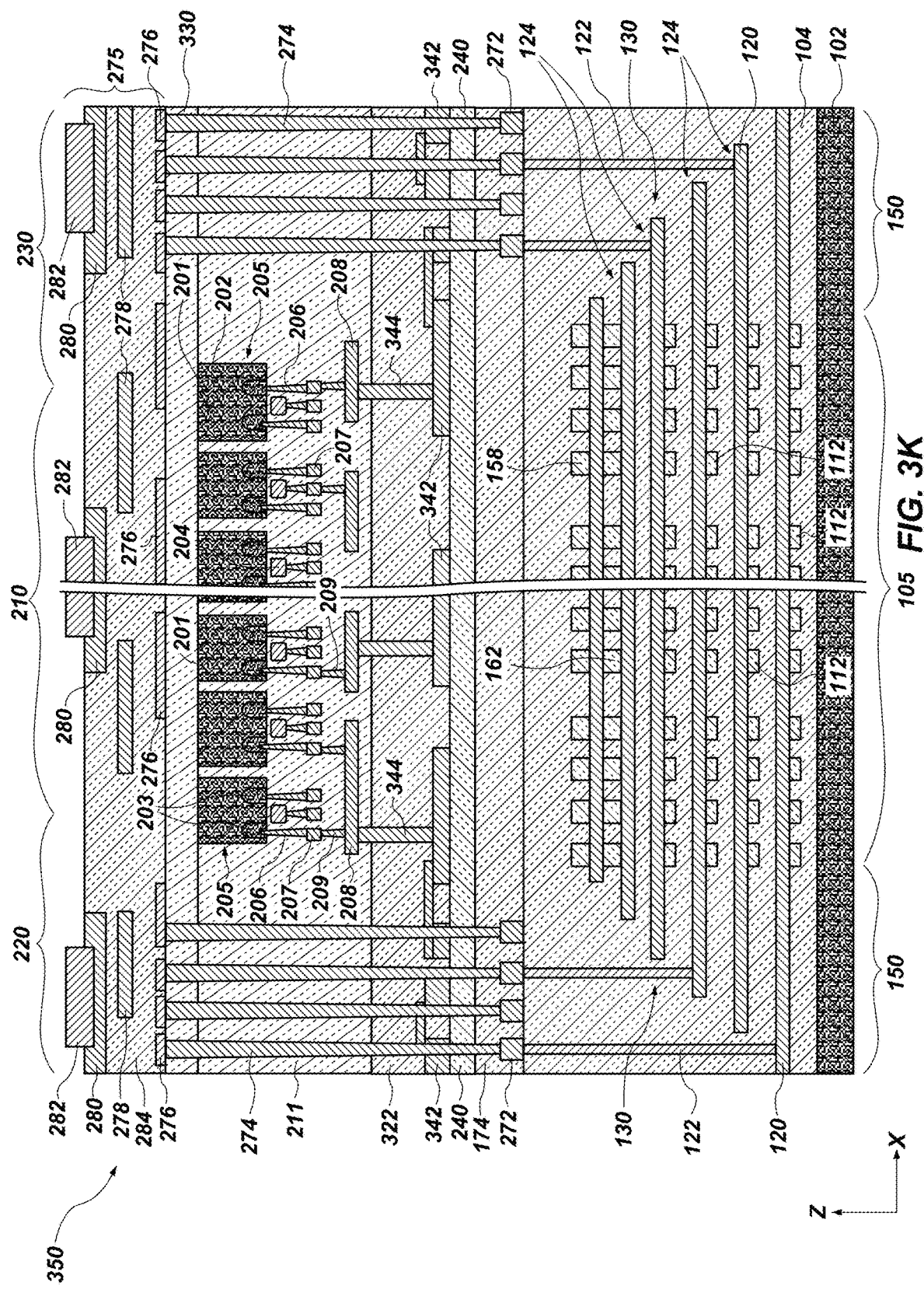

Referring collectively to FIG. 3J and FIG. 3K, which are simplified partial cross-sectional view of the microelectronic device structure assembly 350 illustrating the same cross-sectional views as FIG. 3H and FIG. 3I, respectively, a back end of the line region 275 may be formed vertically (e.g., in the Z-direction) the microelectronic device structure assembly 350, as described above with reference to the back end of the line region 275 (FIG. 2J, FIG. 2K). The back end of the line region 275 may be substantially similar to the back end of the line region 275.

Accordingly, the microelectronic device structure assembly 350 may be formed and electrical connections and routing between different conductive structures and circuitry may of the first microelectronic device structure 300 and the second microelectronic device structure 320 may be formed substantially simultaneously. For example, electrical connections between the first conductive contact structures 122 of the first microelectronic device structure 300 to the fifth conductive pad structures 276 and the pad structures 208 (and to, for example, sub-word line drivers of the sub-word line driver regions 245) of the second microelectronic device structure 320 may be formed substantially simultaneously with formation of electrical connections between the global conductive structures 168 (and the conductive pillar structures 126) of the first microelectronic device structure 300 and one or more of the fifth conductive pad structures 276, the seventh conductive pad structures 338, the sixth conductive interconnect structures 340, and the pad structures 208 (and to, for example, sense amplifiers of the sense amplifier regions 210) of the second microelectronic device structure 320. Further, in some embodiments, electrical connections may be formed between the first conductive pad structure 171 of the socket regions 115 of the first microelectronic device structure 100 and one or more pad structures 208 of the second microelectronic device structure 320. The electrical connections and conductive structures may be formed of a conductive material exhibiting a relatively low RC value and, therefore, a relatively fast data transmission value, facilitate an improved speed of data transfer between the first microelectronic device structure 300 and the second microelectronic device structure 320.

Although FIG. 1A through FIG. 3K have been described and illustrated as comprising a first microelectronic device structure 100, 300 and a second microelectronic device structure 200, 320 having a particular orientation, the disclosure is not so limited. In other embodiments, the first microelectronic device structure 100, 300 comprises vertically (e.g., in the Z-direction) extending conductive pillar structures that are in electrical communication with the channel materials 151 of the access devices 112 and are in electrical communication with, for example, sub-word line driver circuitry of the second microelectronic device structure and the laterally extending (e.g., in the X-direction, in the Y-direction) conductive structures are in electrical communication with other portions of the access devices 112 (e.g., the source material 148) and are in electrical communication with, for example, the sense amplifiers of the second microelectronic device structure. In some such embodiments, the second microelectronic device structure may be substantially the same as the second microelectronic device structures 200, 320 described herein, except that the location of the sense amplifier regions 210 and the sub-word line driver regions 245 may be interchanged with each other.

Thus, in accordance with some embodiments of the disclosure, a microelectronic device comprises a first microelectronic device structure and a second microelectronic device structure attached to the first microelectronic device structure. The first microelectronic device structure comprises a memory array region comprising a stack structure comprising levels of conductive structures vertically alternating with levels of insulative structures, and staircase structures at lateral ends of the stack structure. The memory array region further comprises vertical stacks of memory cells, at least one of the vertical stacks of memory cells comprising stacked capacitor structures, each stacked capacitor structure comprising capacitor structures vertically spaced from each other by at least a level of the levels of insulative structures, transistor structures, each transistor structure operably coupled to a capacitor structure and to one of the conductive structures of the levels of conductive structures, and a conductive pillar structure vertically extending through the transistor structures. The first microelectronic device further comprises conductive contact structures in electrical communication with the levels of conductive structures at steps of the staircase structures. The second microelectronic device comprises control logic devices configured to effectuate at least a portion of control operations for the vertical stacks of memory cells, conductive interconnect structures vertically extending through an oxide material and in electrical communication with the conductive contact structures, and an additional conductive interconnect structure vertically extending through the oxide material and in electrical communication with the conductive pillar structure of the at least one of the vertical stacks of memory cells.

Furthermore, in accordance with additional embodiments of the disclosure, a microelectronic device comprises a first die and a second die bonded to the first die. The first die comprises a memory array region comprising a vertical stack of memory cells, a stack structure comprising alternating conductive structures and insulative structures intersecting the vertical stack of memory cells, lateral edges of the conductive structures and the insulative structures defining steps of a staircase structure, conductive contact structures in electrical communication with the conductive structures, each of the conductive structures individually in electrical communication with one of the conductive contact structures, and conductive pillar structures vertically extending through the memory array region. The second die comprises a word line driver and a sense amplifier. The microelectronic device further comprises first conductive interconnect structures vertically extending through the second die and in electrical communication with the word line driver and the conductive contact structures, and a second conductive interconnect structure vertically extending through the second die and in electrical communication with the sense amplifier and the conductive pillar structures.

Thus, in accordance with yet other embodiments of the disclosure a method of forming a microelectronic device comprises forming a first microelectronic device structure and forming a second microelectronic device structure. The first microelectronic device structure comprises a memory array region comprising vertical stacks of memory cells, a stack structure comprising staircase structures intersecting the vertical stacks of memory cells, conductive structures of the stack structure in electrical communication with memory cells of the vertical stacks of memory cells, conductive contact structures in electrical communication with the conductive structures of the stack structure, conductive pillar structures vertically extending through the vertical stacks of memory cells, and a first oxide material overlying the memory array region and the stack structure. The second microelectronic device structure comprises a word line driver, a sense amplifier, additional control logic devices comprising complementary metal oxide semiconductor circuits, and a second oxide material overlying the word line driver, the sense amplifier, and the additional control logic devices. The method further comprises attaching the first microelectronic device structure to the second microelectronic device structure by bonding the first oxide material to the second oxide material.

Thus, in accordance with further embodiments of the disclosure, a method of forming a microelectronic device comprises forming a first microelectronic device structure and forming a second microelectronic device structure. The first microelectronic device structure comprises vertical stacks of memory cells, conductive structures intersecting the vertical stacks of memory cells, and conductive interconnect structures in electrical communication with the conductive structures. The second microelectronic device structure comprises a sub-word line driver, a sense amplifier; and a second oxide material vertically overlying the sub-word line driver and the sense amplifier. The method further comprises forming sacrificial structures in contact with the conductive interconnect structures, forming a first oxide material over the sacrificial structures, bonding the first oxide material to the second oxide material to attach the first microelectronic device structure to the second microelectronic device structure, and replacing the sacrificial structures with conductive material to electrically connect the conductive interconnect structures to one of the sub-word line driver and the sense amplifier.

Figure 4:
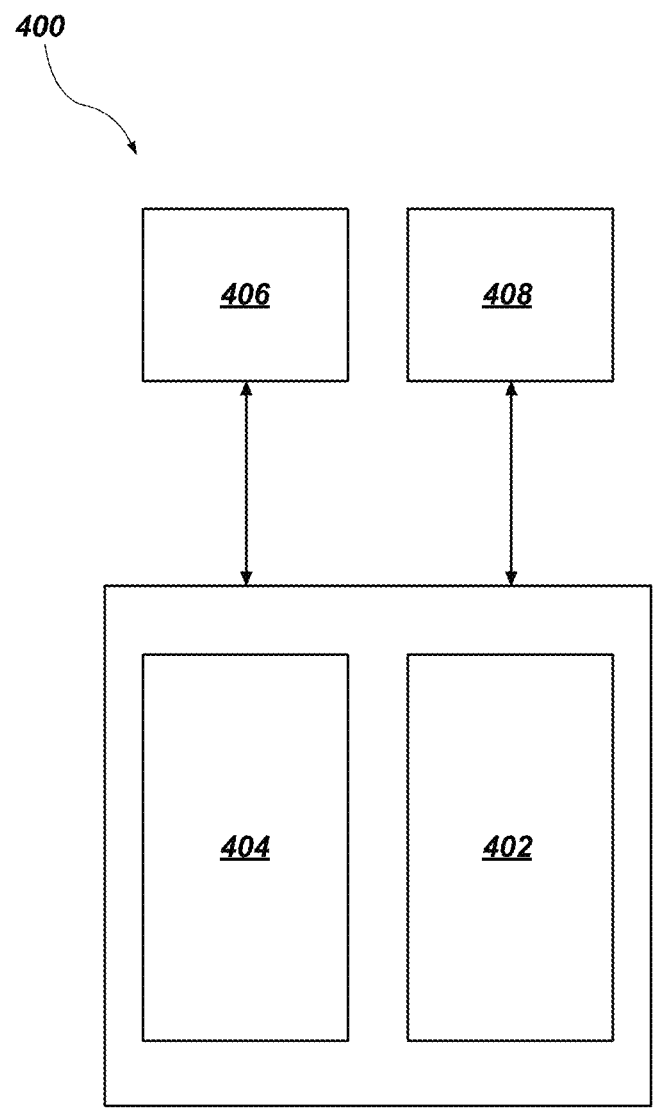
FIG. 4 is a schematic block diagram of an electronic system, in accordance with an embodiment of the disclosure.

Structures, assemblies, and devices in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure, a microelectronic device structure assembly, a relatively larger microelectronic device structure assembly, and a microelectronic device previously described herein with reference to FIG. 1A through FIG. 3K. The electronic system 400 may further include at least one electronic signal processor device 404 (often referred to as a "microprocessor"). The electronic signal processor device 404 may, optionally, include an embodiment of one or more of a microelectronic device structure, a microelectronic device structure assembly, a relatively larger microelectronic device structure assembly, and a microelectronic device previously described herein with reference to FIG. 1A through FIG. 3K. While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure, a microelectronic device structure assembly, a relatively larger microelectronic device structure assembly, and a microelectronic device previously described herein with reference to FIG. 1A through FIG. 3K. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, one or more of a monitor, a display, a printer, an audio output jack, and a speaker. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises a first die and a second die. The first die comprises vertical stacks of memory cells, a stack structure comprising conductive structures interleaved with insulative structures, at least some of the conductive structures in electrical communication with memory cells of the vertical stacks of memory cells, and conductive pillar structures vertically extending through the vertical stacks of memory cells. The second die comprises word line driver circuitry in electrical communication with the conductive structures by means of conductive interconnect structures comprising copper and vertically extending through the second die, and sense amplifier circuitry in electrical communication with the conductive pillar structures by means of additional conductive interconnect structures comprising copper and vertically extending through the second die.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A 3D dynamic random-access memory (DRAM) device, comprising:
an array structure comprising:
a stack structure including levels of DRAM cells vertically stacked relative to one another,
the DRAM cells of each of the levels comprising:
access devices respectively comprising:
source material;
drain material;
channel material horizontally interposed between the source material and the drain material in a first direction; and
gate electrode material vertically overlying the channel material and horizontally extending in a second direction orthogonal to the first direction; and
capacitors horizontally neighboring the access devices in the first direction, the capacitors respectively vertically overlapping and coupled to the drain material of one of the access devices; and
conductive pillars vertically extending completely through the levels of DRAM cells, the conductive pillars coupled to the source material of respective ones of the access devices of the DRAM cells within the levels of DRAM cells; and
a control circuitry structure vertically overlying and directly bonded to the array structure, the control circuitry structure comprising control logic circuitry configured to effectuate control operations for the levels of DRAM cells.

2. The 3D DRAM device of claim 1, wherein the control circuitry structure is directly bonded to the array structure through oxide-to-oxide bonds.

3. The 3D DRAM device of claim 1, wherein the array structure further comprises global conductive structures vertically overlying the stack structure and respectively coupled to a group of the conductive pillars.

4. The 3D DRAM device of claim 3, further comprising:
conductive back-end-of-line (BEOL) structures vertically overlying the control circuitry structure; and
conductive contact structures vertically extending through the control circuitry structure and into the array structure, some of the conductive contact structures coupling some of the conductive BEOL structures to some of the global conductive structures.

5. The 3D DRAM device of claim 4, wherein:
the control logic circuitry of the control circuitry structure includes sense amplifier circuitry horizontally overlapping the DRAM cells of the array structure; and
the some of the conductive BEOL structures are coupled to the sense amplifier circuitry of the control logic circuitry.

6. The 3D DRAM device of claim 5, wherein the array structure further comprises additional conductive contact structures individually vertically extending to and in contact with the gate electrode material for the access devices of a respective one of the levels of DRAM cells.

7. The 3D DRAM device of claim 6, wherein:
some other of the conductive contact structures couple some other of the conductive BEOL structures to the additional conductive contact structures;
the control logic circuitry of the control circuitry structure further includes sub-word line driver circuitry horizontally offset from the sense amplifier circuitry in each of the first direction and the second direction; and
the some other of the conductive BEOL structures are coupled to the sub-word line driver circuitry of the control logic circuitry.

8. The 3D DRAM device of claim 6, wherein:
some of the additional conductive contact structures land on steps of a staircase structure at a first end of the stack structure; and
some other of the additional conductive contact structures land on additional steps of an additional staircase structure at a second end of the stack structure opposing the first end of the stack structure.

9. The 3D DRAM device of claim 6, wherein one of the additional conductive contact structures horizontally neighboring an additional one of the additional conductive contact structures in the second direction is horizontally offset from the additional one of the additional conductive contact structures in the first direction.

10. The 3D DRAM device of claim 1, further comprising:
a conductive plate structure vertically extending through the stack structure and horizontally extending in the second direction, the conductive plate structure coupled to the source material of the access devices of the DRAM cells of the levels of DRAM cells; and
an additional conductive plate structure vertically extending through the stack structure and horizontally extending in the second direction, the additional conductive plate structure coupled to the capacitors of the DRAM cells of the levels of DRAM cells.

11. The 3D DRAM device of claim 1, wherein gate electrodes of transistors of the control logic circuitry of the control circuitry structure are positioned relatively more vertically proximate to the stack structure of the array structure than are source and drain regions of the transistors.

12. A memory device, comprising:
a first structure comprising:
an array region comprising:
levels of volatile memory cells vertically stacked relative to one another, the volatile memory cells of each of the levels comprising:
access devices; and
storage node devices coupled to the access devices, each of the storage node devices vertically overlapping and horizontally neighboring a respective one of the access devices; and
conductive pillars vertically extending completely through the levels of volatile memory cells, the conductive pillars coupled to the access devices of the volatile memory cells within the levels of volatile memory cells; and
a conductive contact region horizontally neighboring the array region and comprising:

a staircase structure having steps at the levels of volatile memory cells; and
conductive contact structures in contact with at least some of the steps of the staircase structure; and
a second structure attached to the first structure through oxide-to-oxide bonding, the second structure comprising:
a sense amplifier region horizontally overlapping the array region of the first structure and comprising sense amplifier circuitry coupled to the conductive pillars within the array region of the first structure; and
a sub-word line driver region horizontally offset from the sense amplifier region and comprising sub-word line driver circuitry coupled to the conductive contact structures within the conductive contact region of the first structure.

13. The memory device of claim 12, wherein the second structure further comprises a conductive contact exit region horizontally overlapping the conductive contact region of the first structure and comprising interconnect structures coupled to the conductive contact structures of the conductive contact region of the first structure and the sub-word line driver circuitry of the sub-word line driver region of the second structure.

14. The memory device of claim 12, wherein the second structure further comprises an additional region horizontally neighboring the sense amplifier region in a first direction and the sub-word line driver region in a second direction orthogonal to the first direction, the additional region comprising one or more of voltage pump circuitry, delay-locked loop (DLL) circuitry, drain supply voltage ($V_{dd}$) regulator circuitry, chip/deck control circuitry, and block switch circuitry.

15. The memory device of claim 12, wherein:
array region of the first structure further comprises a conductive routing structure coupled to a group of the conductive pillars;
the first structure further comprises a socket region horizontally neighboring the array region and including a deep conductive contact structure vertically underlying and in contact with the conductive routing structure, the deep conductive contact structure vertically extending through a majority of the first structure; and
the second structure further comprises an additional socket region horizontally overlapping the socket region of the first structure and comprising an additional conductive contact structure vertically overlying and in contact with the conductive routing structure, the additional conductive contact structure vertically extending through a majority of the second structure.

16. The memory device of claim 12, further comprising conductive back-end-of-line (BEOL) structures vertically overlying the second structure, some of the conductive BEOL structures coupling the sense amplifier circuitry of the second structure to the conductive pillars of the first structure, and some other of the conductive BEOL structures coupling the sub-word line driver circuitry of the second structure to the conductive contact structures of the first structure.

17. The memory device of claim 12, wherein the access devices of the volatile memory cells of the levels of volatile memory cells respectively comprise:
source material in contact with a respective one of the conductive pillars;
drain material in contact with a respective one of the storage node devices;
channel material horizontally interposed between the source material and the drain material in a first direction;
a gate electrode vertically overlying the channel material and horizontally extending in a second direction orthogonal to the first direction; and
gate dielectric material vertically interposed between the gate electrode and the channel material.

18. The memory device of claim 17, wherein the storage node devices of the volatile memory cells of the levels of volatile memory cells comprise capacitors respectively including two electrode structures and dielectric material horizontally interposed between the two electrode structures.

19. The memory device of claim 12, wherein the volatile memory cells comprise dynamic random-access memory (DRAM) cells.

20. An electronic system, comprising:
a processor device operably coupled to an input device and an output device; and
a 3D dynamic random-access memory (DRAM) device operably coupled to the processor device and comprising:
an array structure comprising:
levels of DRAM cells vertically stacked relative to one another, the DRAM cells of each of the levels comprising:
access transistors respectively comprising a source region, a drain region, a channel region interposed between the source region and the drain region in a first horizontal direction, gate electrode overlying the channel region and extending in a second horizontal direction orthogonal to the first horizontal direction; and
capacitors neighboring the access transistors in the first horizontal direction, the capacitors respectively vertically overlapping and coupled to the drain region of one of the access transistors; and
conductive digit line structures vertically extending completely through the levels of DRAM cells, the conductive digit line structures coupled to the source region of respective ones of the access transistors of the DRAM cells within the levels of DRAM cells; and
a control circuitry structure attached to the array structure through oxide-to-oxide bonding and comprising sense amplifier circuitry vertically overlying, horizontally overlapping, and coupled to the conductive digit line structures.

* * * * *

UNITED STATES PATENT AND TRADEMARK OFFICE
CERTIFICATE OF CORRECTION

| | | Page 1 of 1 |
|---|---|---|
| PATENT NO. | : 12,113,052 B2 | |
| APPLICATION NO. | : 18/491678 | |
| DATED | : October 8, 2024 | |
| INVENTOR(S) | : Fatma Arzum Simsek-Ege | |

It is certified that error appears in the above-identified patent and that said Letters Patent is hereby corrected as shown below:

In the Specification

Column 1, Lines 8-9, change "U.S. Pat. No. 11,843,309, issued" to -- U.S. Pat. No. 11,848,309, issued --

Signed and Sealed this
Twenty-sixth Day of November, 2024

Katherine Kelly Vidal
*Director of the United States Patent and Trademark Office*